(12) United States Patent
Choi

(10) Patent No.: US 11,482,291 B2
(45) Date of Patent: Oct. 25, 2022

(54) MEMORY DEVICE AND METHOD OF OPERATING THE SAME

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/220,403

(22) Filed: Apr. 1, 2021

(65) Prior Publication Data
US 2022/0108757 A1    Apr. 7, 2022

(30) Foreign Application Priority Data
Oct. 6, 2020 (KR) .................. 10-2020-0128791

(51) Int. Cl.
*G11C 16/10* (2006.01)
*G11C 16/34* (2006.01)
*G11C 16/26* (2006.01)
*G11C 16/30* (2006.01)
*G11C 7/10* (2006.01)
*G11C 16/24* (2006.01)
*G11C 16/32* (2006.01)

(52) U.S. Cl.
CPC .......... *G11C 16/3459* (2013.01); *G11C 7/106* (2013.01); *G11C 7/1009* (2013.01); *G11C 7/1087* (2013.01); *G11C 16/10* (2013.01); *G11C 16/24* (2013.01); *G11C 16/26* (2013.01); *G11C 16/30* (2013.01); *G11C 16/32* (2013.01)

(58) Field of Classification Search
CPC ... G11C 16/3459; G11C 7/1009; G11C 7/106; G11C 7/1087; G11C 16/10; G11C 16/24; G11C 16/26; G11C 16/30; G11C 16/32; G11C 7/02; G11C 7/08; G11C 11/5642; G11C 16/0483; G11C 7/065
See application file for complete search history.

(56) References Cited

U.S. PATENT DOCUMENTS

| 2015/0332777 A1* | 11/2015 | Yoon | G11C 11/5642 365/185.12 |
| 2021/0005271 A1* | 1/2021 | Shin | G11C 16/08 |

FOREIGN PATENT DOCUMENTS

| KR | 10-2017-0098716 | 8/2017 |
| KR | 10-2018-0032434 | 3/2018 |

* cited by examiner

*Primary Examiner* — Xiaochun L Chen
(74) *Attorney, Agent, or Firm* — IP & T Group LLP

(57) ABSTRACT

The present technology relates to an electronic device. A memory device that reduces noise generated during a sensing operation includes a plurality of pages, each including a plurality of memory cells, a peripheral circuit configured to sense a selected page among the plurality of pages, the selected page including a selected memory cell and a sensing node controller configured to control, based on a result of a first sensing operation among a plurality of sensing operations that are performed to sense a logical page among a plurality of logical pages in the selected page, a sensing node in a page buffer coupled to the selected memory cell through a bit line during a second sensing operation.

19 Claims, 18 Drawing Sheets

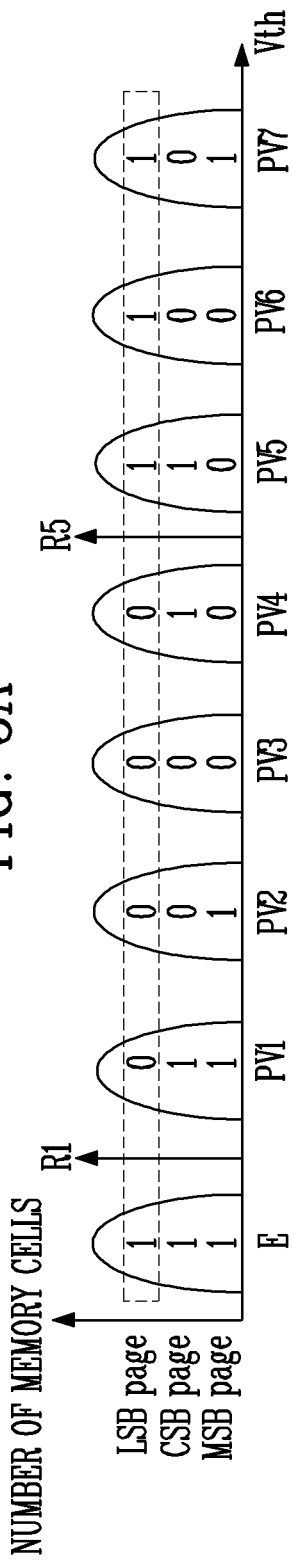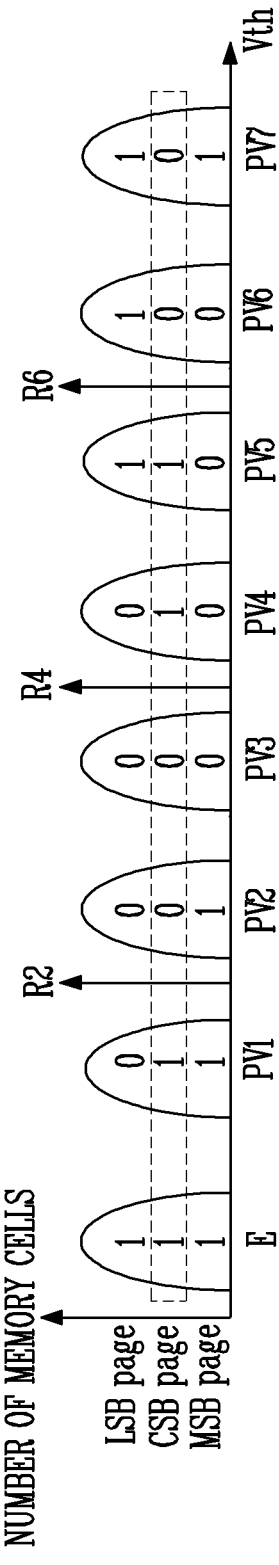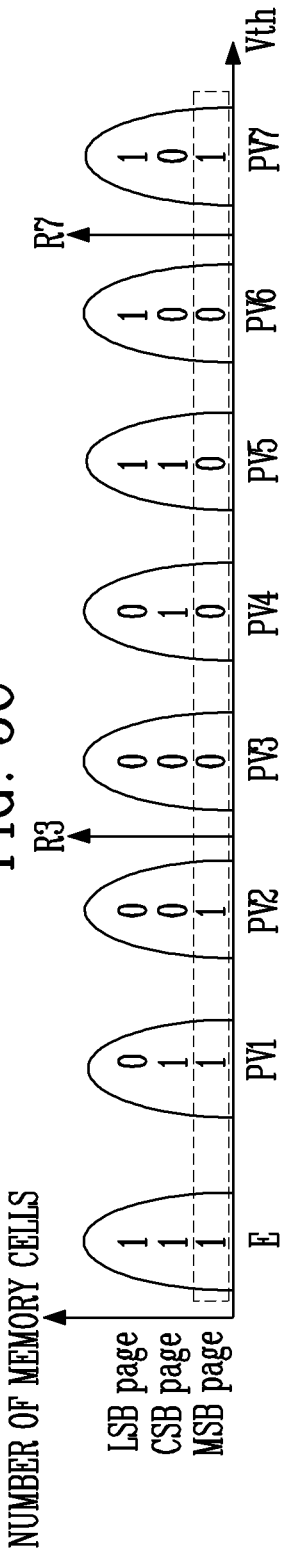

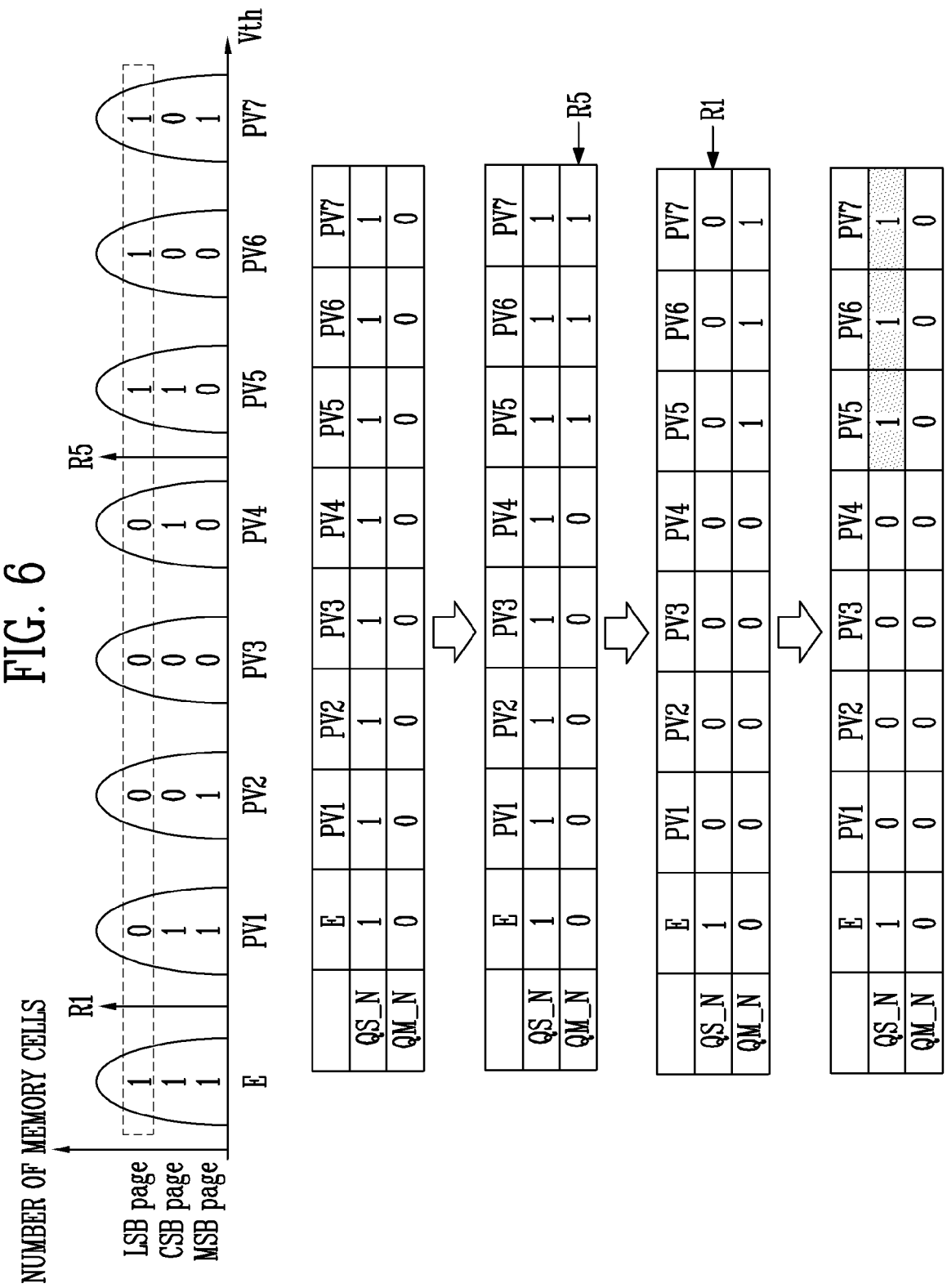

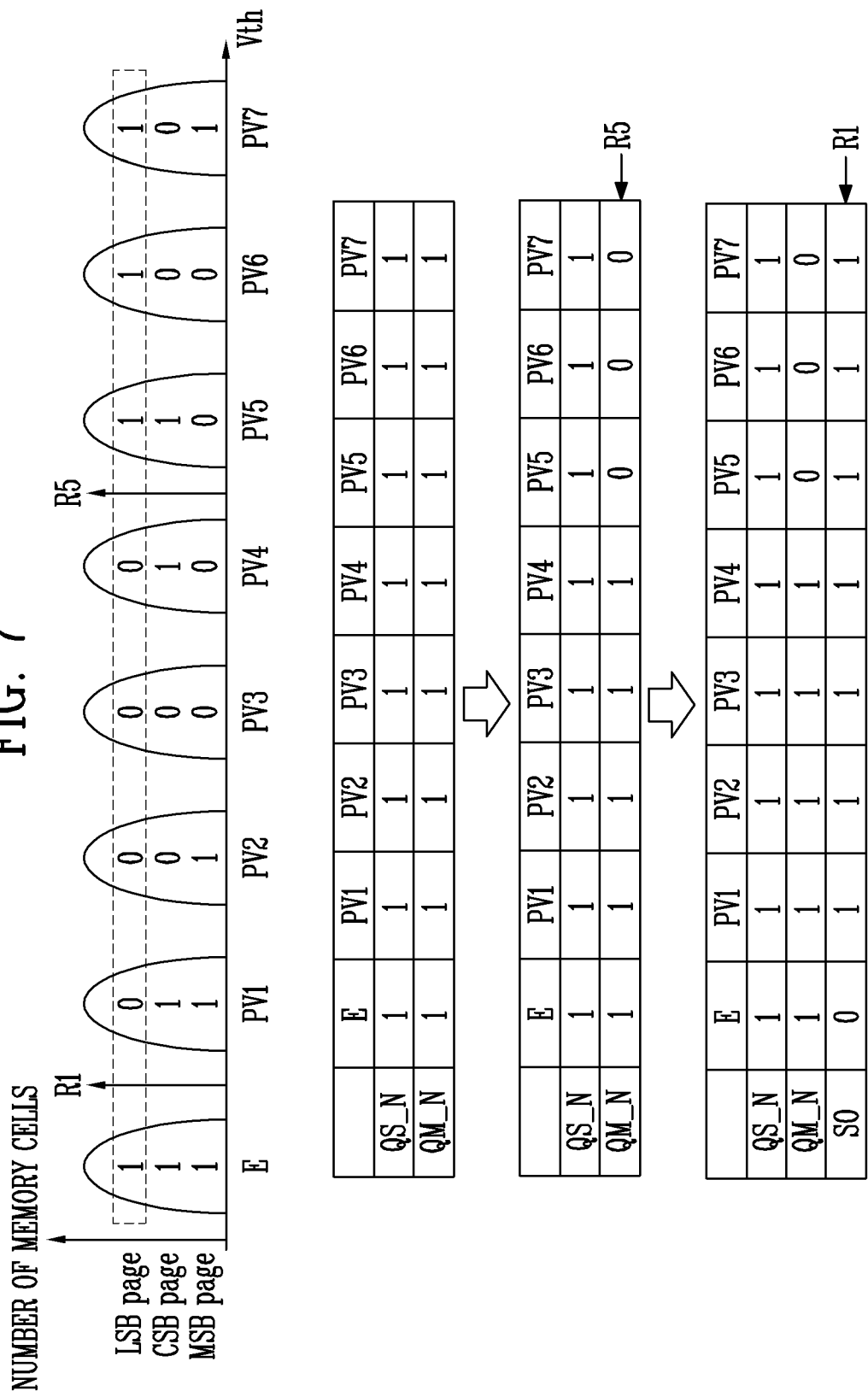

MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0128791, filed on Oct. 6, 2020, with the Korean Intellectual Property Office and which is incorporated herein by reference in its entirety.

BACKGROUND

Field of Invention

One or more embodiments described herein relate to an electronic device, and more particularly to a memory device and a method of operating the same.

Description of Related Art

A storage device stores data under control of a host device, such as a computer, a smart phone, or a smart pad. The storage device may store data in various types of memory devices. Examples include a magnetic disk such as a hard disk drive (HDD), a semiconductor memory such as a solid state drive (SSD), a memory card, or another type of memory device.

In some cases, the storage device may include a memory device in which data is stored and a memory controller that controls the storage of data in the memory device. The memory device may be classified as volatile memory or a nonvolatile memory. Examples of nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

SUMMARY

An embodiment of the present disclosure provides a memory device that reduces noise generated during a sensing operation, and a method of operating the same.

According to an embodiment of the present disclosure, a memory device may include a plurality of pages, each including a plurality of memory cells, a peripheral circuit configured to sense a selected page among the plurality of pages, the selected page including a selected memory cell and a sensing node controller configured to control, based on a result of a first sensing operation among a plurality of sensing operations that are performed to sense a logical page among a plurality of logical pages in the selected page, a sensing node in a page buffer coupled to the selected memory cell through a bit line during a second sensing operation.

According to an embodiment of the present disclosure, a method of operating a memory device configured to sense a selected page including a selected memory cell, among a plurality of pages each including a plurality of memory cells may include performing a first sensing operation to sense a logical page among a plurality of logical pages in the selected page and controlling, during a second sensing operation for sensing the logical page, a sensing node in a page buffer coupled to the selected memory cell through a bit line, based on a result of the first sensing operation.

According to an embodiment of the present disclosure, a method of operating a memory device configured to sense a selected page in which a selected memory cell is included among a plurality of pages each including a plurality of memory cells may include controlling, according to sensing data obtained by one or more sensing operations that are performed before a last sensing operation among a plurality of sensing operations performed to sense a logical page among a plurality of logical pages, a sensing node in a page buffer coupled to the selected memory cell through a bit line during the last sensing operation.

According to an embodiment of the present disclosure, an apparatus may include an output coupled to a sensing node of a page buffer and a controller configured to generate a masking value for transfer to the sensing node through the output based on a result of a first sensing operation different from a second sensing operation, wherein the second sensing operation is performed after the first sensing operation and during a time when the sensing node is coupled to a selected memory cell.

According to the present technology, the number of flipped latches in a page buffer may be decreased by masking a sensing node value based on sensed data before a last sensing operation is performed, thereby reducing occurrence of noise.

BRIEF DESCRIPTION OF THE DRAWINGS

FIGS. 5A to 5C illustrate an embodiment of a method of sensing a plurality of logical pages included in one page.
FIG. 6 illustrates an embodiment of a method of sensing a least significant bit (LSB) page.
FIG. 7 illustrates example values of a sensing node when sensing an LSB page.

DETAILED DESCRIPTION

Specific structural or functional descriptions of embodiments are disclosed in the present specification or application are illustrated only to describe the embodiments according to the present disclosure. The embodiments according to the present disclosure may be carried out in various forms and the descriptions are not limited to the embodiments described in the present specification or application.

Hereinafter, embodiments of the present disclosure will be described in detail with reference to the accompanying drawings, so that those skilled in the art to which the present disclosure pertains may easily carry out the technical spirit of the present disclosure.

Figure 1:
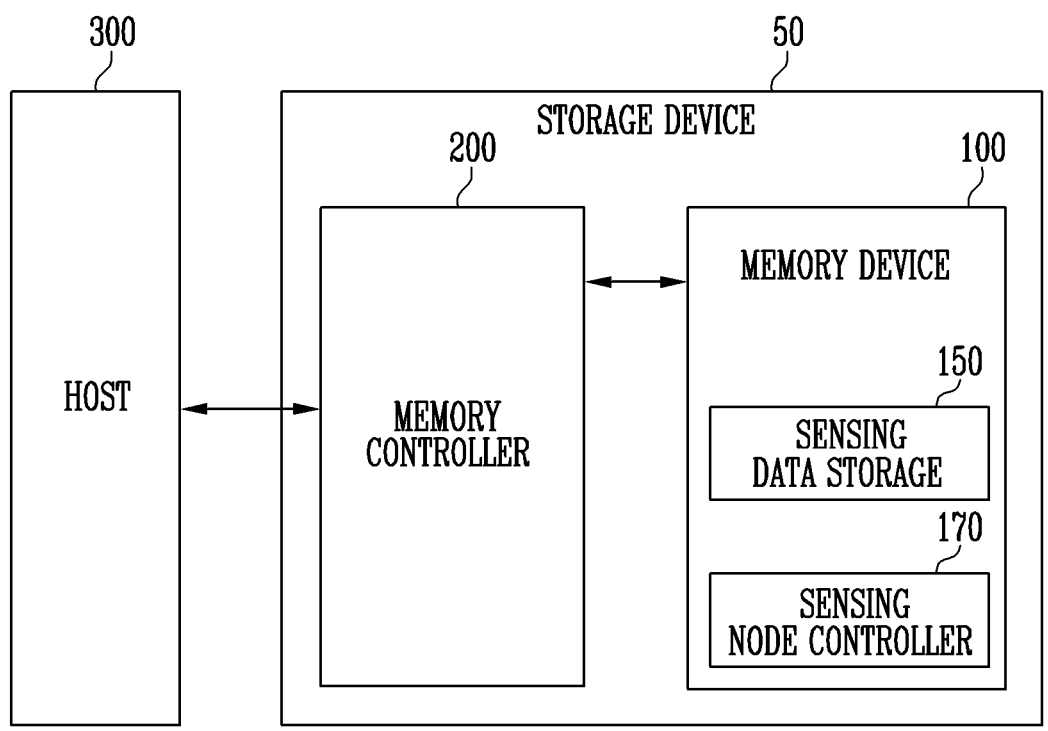
FIG. 1 illustrates an embodiment of a storage device.

FIG. 1 is a block diagram illustrating an embodiment of a storage device 50, which may include a memory device 100 and a memory controller 200. The storage device 50 may store data under control of a host 300. Examples of the host 300 include a cellular phone, a smartphone, an MP3 player, a laptop computer, a desktop computer, a game player, a TV, a tablet PC, or an in-vehicle infotainment system.

The storage device 50 may be of a type compatible with the communication standard or protocol of a host interface of the host 300. Examples of the storage device 50 include an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured according to various types of packages. Examples include package on package (POP), system in package (SIP), system on chip (SOC), multi-chip package (MCP), chip on board (COB), wafer-level fabricated package (WFP), and wafer-level stack package (WSP).

The memory device 100 may store data and operate in response to control of the memory controller 200. The memory device 100 may include one or more memory cell arrays, each of which may include a plurality of memory cells that store data. The memory cell array may include a plurality of memory blocks, each of which may include a plurality of memory cells. A plurality of memory cells may configure one or a plurality of pages. In an embodiment, a page may be a unit for storing data in the memory device 100 or reading data stored in the memory device 100. The memory block may be a unit for erasing data.

The memory device 100 may be, for example, a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. For convenience of description, it may be assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. Additionally, embodiments may be applied not only to a flash memory device (in which a charge storage layer is configured of a conductive floating gate (FG)), but also to a charge trap flash (CTF) in which the charge storage layer is configured of an insulating film.

In an embodiment, the memory device 100 may operate in a single level cell (SLC) method in which one data bit is stored in one memory cell. In an embodiment, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive commands and addresses from the memory controller 200 and access an area selected by corresponding ones of the addresses in the one or more memory cell arrays. For example, the memory device 100 may perform an operation corresponding to a command on an area selected by an address. Examples of the operation performed by the memory device 100 include a write operation (program operation), a read operation, or an erase operation according to the received command. When a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a sensing data storage 150 which may store data sensed from a memory cell array during a sensing operation. The sensing operation may be, for example, a verify operation among a program operation and the verify operation included in a program loop or a read operation.

For example, during a sensing operation on a selected page (among a plurality of pages included in the memory cell array), a sensing operation may be performed on a plurality of logical pages in the selected page. In addition, during a sensing operation on any one of the plurality of logical pages, a sensing operation may be performed with a sensing voltage of a first (e.g., high) level and then a sensing operation may be performed with a sensing voltage of a second (e.g., low) level. In another embodiment, the first level may be a low level and the second level may be a high level depending, for example, on the conductivity of the transistors used and/or other design requirements.

When the sensing operation is performed with the sensing voltage of the high level and then the sensing operation is performed with the sensing voltage of the low level, the number of times latches in a page buffer are flipped may be increased.

Therefore, in accordance with one or more embodiments, a method is provided of masking a sensing node during a secondarily performed sensing operation based on sensing data obtained during a firstly performed sensing operation. Data may then be sensed according to a result of the masking.

In an embodiment, the memory device 100 may include a sensing node controller 170 which may mask the sensing node based on the sensing data stored in the sensing data storage 150. For example, assuming that a selected page is configured of three logical pages and the sensing operation is a read operation, two read operations may be performed during a read operation on a least significant bit (LSB) page: first, a first read operation may be performed with a first read voltage of a high level, and then a second read operation may be performed with a second read voltage of a low level.

In an embodiment, the sensing node controller 170 may mask the sensing node during the second read operation based on a result of performing the first read operation. For example, since the first read voltage may be greater than the second read voltage, the number of latches flipped by the second read operation may be increased. Therefore, the sensing node controller 170 may mask the sensing node to indicate the flipped latch during the first read operation.

When the sensing node is masked, the memory device 100 may store data in the latch based on the sensing node. For example, when a value of the sensing node is '1', a default value of the latch may be maintained. When the value of the sensing node is '0', the default value of the latch may be changed and the changed value may be stored in the latch.

As a result, the number of flipped latches may be decreased by masking the sensing node during a next read operation based on data read with a high read voltage. Since the number of flipped latches is decreased, noise of the sensing operation may be reduced.

The memory controller 200 may control an overall operation of the storage device 50. When a power voltage is applied to the storage device 50, the memory controller 200 may execute firmware. When the memory device 100 is a flash memory device 100, the memory controller 200 may operate firmware (such as a flash translation layer (FTL)) to control communication between the host 300 and the memory device 100.

In an embodiment, the memory controller 200 may include firmware that may receive data and a logical block address (LBA) from the host 300 and may translate the LBA into a physical block address (PBA) indicating an address of memory cells in which data is to be stored in the memory device 100. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or another operation according to the request of the host 300. For example, when a program request is received from the host 300, the memory controller 200 may convert the program request to a program command and may provide the program command, the PBA, and data to the memory device 100. When a read request is received from the host 300 together with the LBA, the memory controller 200 may change the read request to a read command, select a PBA corresponding to the LBA, and then provide the read command and the PBA to the memory device 100. When an erase request is received from the host 300 together with the LBA, the memory controller 200 may change the erase request to an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 in order to perform one or more background operations, e.g., a program operation for wear leveling, a program operation for garbage collection, or another operation.

In an embodiment, the storage device 50 may further include a buffer memory. In operation, the memory controller 200 may control data exchange between the host 300 and the buffer memory. In one embodiment, the memory controller 200 may temporarily store system data for controlling the memory device 100 in the buffer memory. For example, the memory controller 200 may temporarily store data input from the host 300 in the buffer memory and then may transmit data temporarily stored in the buffer memory to the memory device 100.

In one embodiment, the buffer memory may be used as an operation memory and/or a cache memory of the memory controller 200, and may store codes or commands executed by the memory controller 200. In one embodiment, the buffer memory may store data processed by the memory controller 200. Examples of the buffer memory include a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), a Rambus dynamic random access memory (DRAM), or a static random access memory (SRAM).

In various embodiments, the buffer memory may be connected from outside the storage device 50. For example, volatile memory devices connected from outside the storage device 50 may serve as the buffer memory.

In an embodiment, the memory controller 200 may control two or more memory devices. In this case, the memory controller 200 may control the memory devices according to, for example, an interleaving method in order to improve operation performance.

The host 300 may communicate with the storage device using at least one communication protocol or standard. Examples include a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
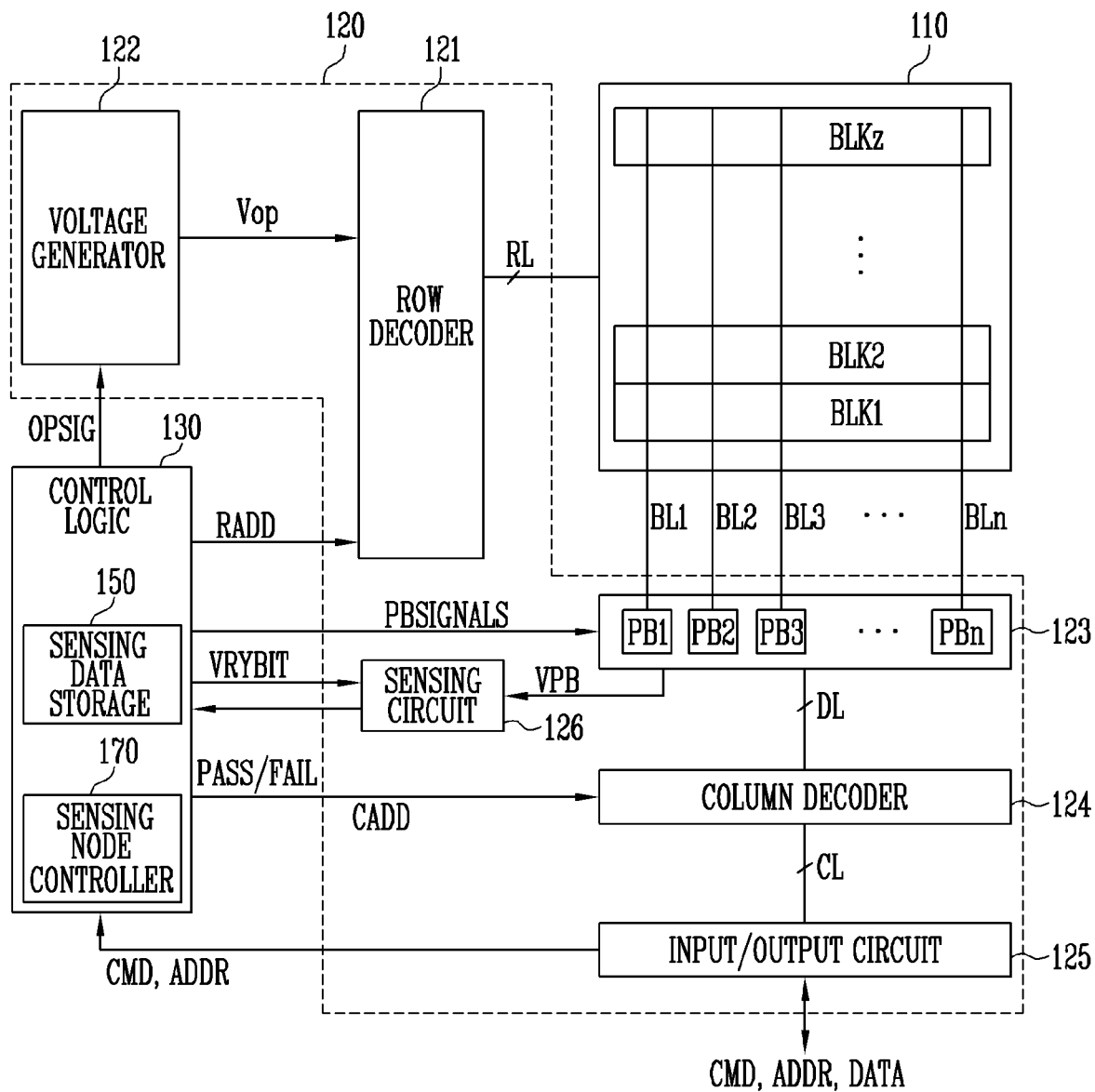
FIG. 2 illustrates an embodiment of a memory device.

FIG. 2 is a diagram illustrating an embodiment of the memory device 100 of FIG. 1. Referring to FIG. 2, the memory device 100 may include a memory cell array 110, a peripheral circuit 120, and a control logic 130.

The memory cell array 110 includes a plurality of memory blocks BLK1 to BLKz connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform a program operation, read operation, or erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126. The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the selected memory block to apply the voltages generated by the voltage generator 122 to the at least one word line WL according to the decoded address.

For example, during a program operation, row decoder 121 may apply a program voltage to a selected word line and apply a program pass voltage of a level lower than the program voltage to an unselected word line. During a program verify operation, row decoder 121 may apply a verify voltage to the selected word line and a verify pass voltage higher than the verify voltage to the unselected word line. During the read operation, row decoder 121 may apply a read voltage to the selected word line and apply a read pass voltage higher than the read voltage to the unselected word line.

In an embodiment, an erase operation of the memory device 100 is performed in a memory block unit. During an erase operation, row decoder 121 may select one memory block according to the decoded address. During an erase operation, row decoder 121 may apply a reference (e.g., ground) voltage to the word lines connected to the selected memory block.

The voltage generator 122 operates in response to control of the control logic 130. The voltage generator 122 may be configured to generate a plurality of voltages using an external power voltage supplied to the memory device 100. For example, voltage generator 122 may generate various operation voltages Vop used for the program, read, and erase operations, in response to operation signal OPSIG. For example, the voltage generator 122 may generate a program voltage, a verify voltage, a pass voltage, a read voltage, an erase voltage, and/or one or more other voltages in response to the control of the control logic 130.

As an embodiment, voltage generator 122 may generate an internal power voltage by regulating the external power voltage. The internal power voltage generated by the voltage generator 122 is used as an operation voltage of the memory device 100.

As an embodiment, voltage generator 122 may generate a plurality of voltages using the external power voltage or the internal power voltage. For example, voltage generator 122 may include a plurality of pumping capacitors that receive the internal power voltage and may selectively activate the plurality of pumping capacitors to generate the plurality of voltages, in response to the control of the control logic 130. The generated plurality of voltages may be supplied to the memory cell array 110 by the row decoder 121.

The page buffer group 123 includes first to n-th page buffers PB1 to PB connected to the memory cell array 110 through the first to n-th bit lines BL1 to BLn, respectively.

The first to n-th page buffers PB1 to PBn operate in response to control of the control logic 130. For example, the first to n-th page buffers PB1 to PBn may operate in response to page buffer control signals PBSIGNALS. In one embodiment, the first to n-th page buffers PB1 to PBn may temporarily store data received through the first to n-th bit lines BL1 to BLn or may sense a voltage or a current of the bit lines BL1 to BLn during the read or verify operation.

During the program operation, when the program voltage is applied to the selected word line, the first to n-th page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to n-th page buffers PB1 to PBn may read page data by sensing the voltage or the current from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and output the read data DATA to the input/output circuit 125 under control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL or may exchange data with the input/output circuit 125 through column lines CL.

The input/output circuit 125 may transfer a command CMD and address ADDR received from the memory controller 200 of FIG. 1 (e.g., as described with reference to FIG. 1) to control logic 130 or may exchange data DATA with column decoder 124.

The sensing circuit 126 may generate a reference current in response to a permission bit signal VRYBIT during the read operation or the verify operation, and may compare a sensing voltage VPB received from the page buffer group 123 with a reference voltage generated by the reference current to output a pass signal PASS or a fail signal FAIL.

The control logic 130 may output the operation signal OPSIG, row address RADD, page buffer control signals PBSIGNALS, and permission bit signal VRYBIT in response to the command CMD and address ADDR to control the peripheral circuit 120. For example, the control logic 130 may control the read operation of the selected memory block in response to a sub block read command and the address. The control logic 130 may control the erase operation of the selected sub block included in the selected memory block in response to the sub block erase command and the address. The control logic 130 may determine whether the verity operation is passed or failed in response to the pass signal PASS or the fail signal FAIL.

In an embodiment, the control logic 130 may include the sensing data storage 150 and the sensing node controller 170. In one embodiment, the sensing data storage 150 and the sensing node controller 170 may be included outside the control logic 130. For example, sensing data storage 150 and sensing node controller 170 may be in each page buffer in page buffer group 123.

In an embodiment, when the memory device 100 performs the sensing operation on the selected page, the sensing data storage 150 may store the sensed data, and the sensing node controller 170 may perform masking on the sensing node. For example, during a sensing operation on any one of the plurality of logical pages in the selected page, the memory device 100 may perform the sensing operation with the sensing voltage of the high level and then may perform the sensing operation with the sensing voltage of the low level. At this time, a large number of latches in the page buffer may be flipped in a process of performing the sensing operation with the sensing voltage of the low level.

Therefore, the sensing data storage 150 may store data sensed with sensing voltage of the high level. Thereafter, the sensing node controller 170 may mask the sensing node based on the sensing data stored in the sensing data storage 150. For example, the sensing node controller 170 may perform a masking operation indicating a latch flipped when sensing with the sensing voltage of the high level.

When the sensing node is masked, the memory device 100 may store data in the latch based on the sensing node. For example, when the value of the sensing node is '1', the default value of the latch may be maintained. When the value of the sensing node is '0', the default value of the latch may be changed and the changed value may be stored in the latch. As a result, the number of flipped latches may be decreased by masking the sensing node during a next read operation based on data read with a high read voltage. Since the number of flipped latches is decreased, noise of the sensing operation may be reduced.

Figure 3:
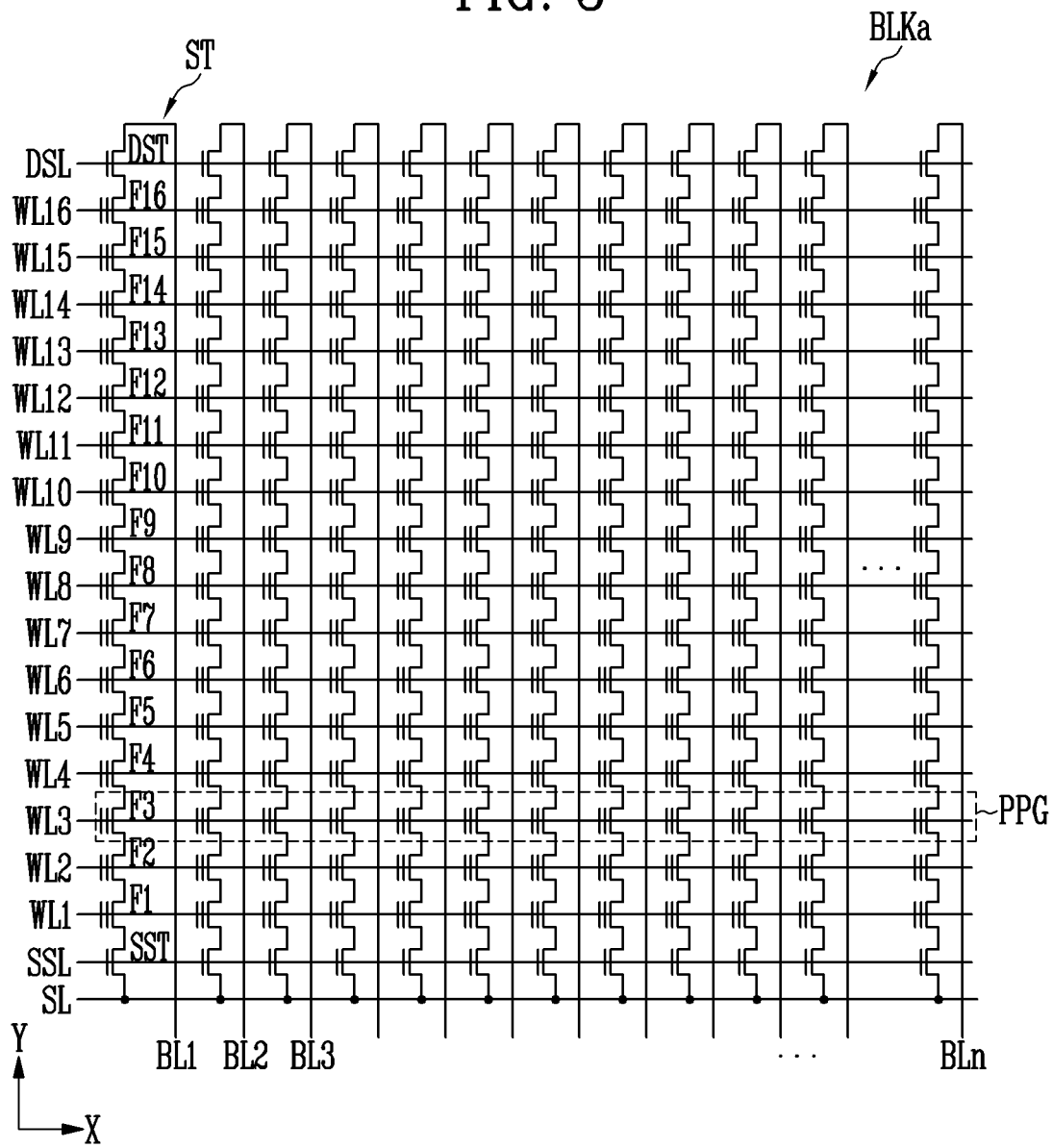
FIG. 3 illustrates an embodiment of a memory cell array.

FIG. 3 is a diagram illustrating an embodiment of the memory cell array of FIG. 2. In particular, FIG. 3 is a circuit diagram showing a memory block BLKa which may be representative of any of the plurality of memory blocks BLK1 to BLKz in the memory cell array 110 of FIG. 2.

Referring to FIG. 3, a first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

In one embodiment, memory block BLKa may include a plurality of strings connected between the bit lines BL1 to BLn and a source line SL. The bit lines BL1 to BLn may be connected to the strings, respectively, and the source line SL may be commonly connected to the strings. Since the strings may be configured to be identical to each other, a string ST connected to the first bit line BL1 will be specifically described as an example.

The string ST may include a source select transistor SST, a plurality of memory cells F1 to F16, and a drain select transistor DST connected in series between the source line SL and the first bit line BL1. One string ST may include one or more source select transistor SST and one or more drain select transistor DST, and may include memory cells F1 to F16. The number of memory cells may vary among embodiments.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL. Gates of the drain select transistors DST may be connected to the drain select line DSL. Gates of the memory cells F1 to F16 may be connected to a plurality of word lines WL1 to WL16. A group of memory cells connected to the same word line (among the memory cells included in different strings) may be referred to as a physical page PPG. Therefore, the memory block BLKa may include the physical pages PPG of the number of the word lines WL1 to WL16.

One memory cell may store one bit of data and thus may be referred to as a single level cell (SLC). In this case, one physical page PPG may store one logical page (LPG) data. One logical page (LPG) data may include data bits of a number equal to the number of memory cells in one physical page PPG. In one embodiment, one memory cell may store two or more bits of data and thus may be referred to as a multi-level cell (MLC). In this case, one physical page PPG may store two or more logical page (LPG) data.

A memory cell in which two or more bits of data are stored in one memory cell is referred to as the MLC. As the number of bits of data stored in one memory cell increases, MLC may refer to a memory cell in which two bits of data is stored. A memory cell in which three bits of data are stored may be referred to as a triple level cell (TLC). A memory cell in which four bits of data are stored may be referred to as a quadruple level cell (QLC). The present embodiment may be applied to the memory device 100 in which two or more bits of data are stored in one memory cel.

In one embodiment, the memory block may have a three-dimensional structure. Each memory block includes a plurality of memory cells stacked on a substrate. Such plurality of memory cells are arranged along a +X direction, a +Y direction, and a +Z direction.

Figure 4:
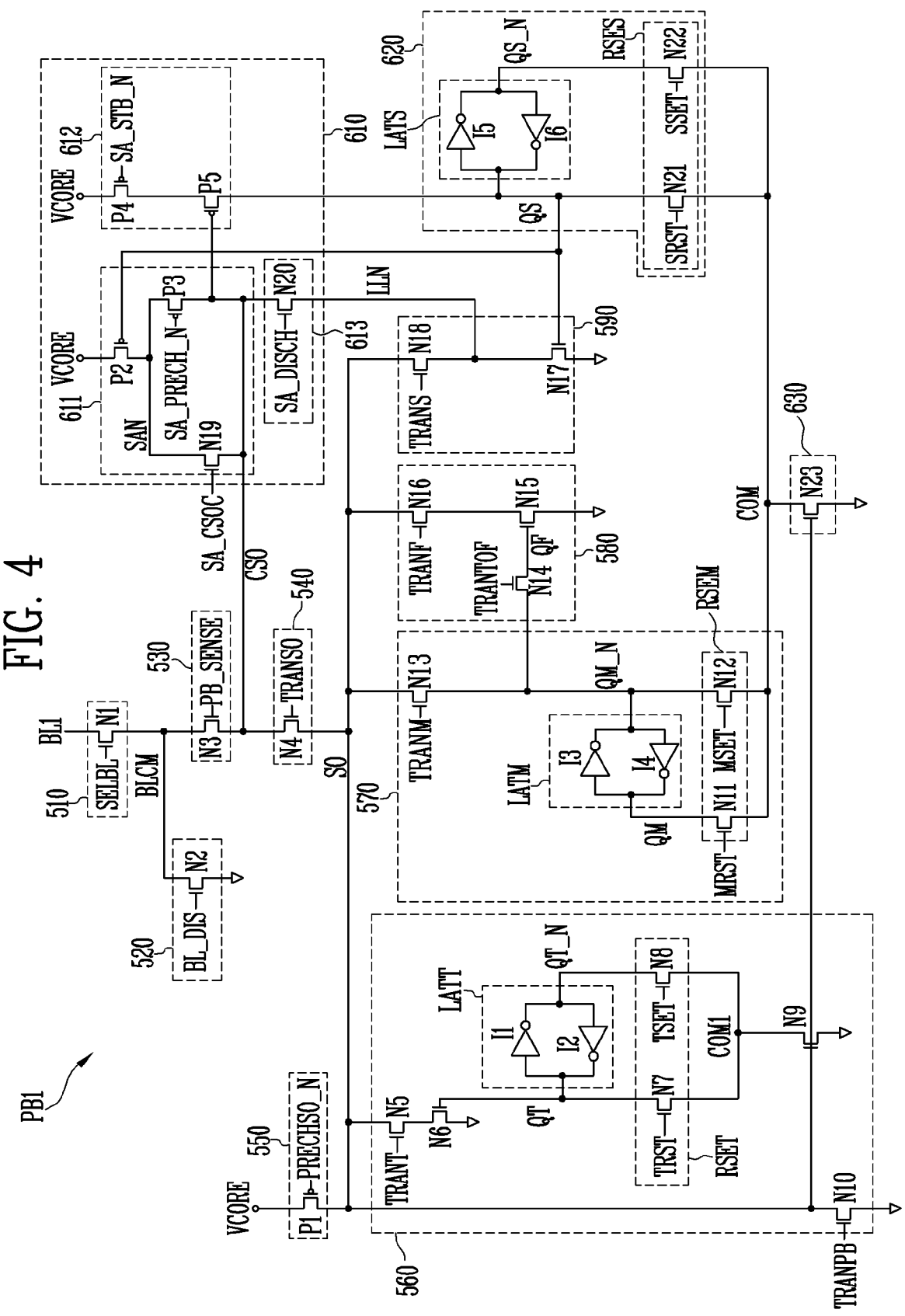
FIG. 4 illustrates an embodiment of a page buffer.

FIG. 4 is a circuit diagram illustrating a page buffer PB1 according to an embodiment. Referring to FIGS. 2 and 4, page buffer PB1 may be representative of the plurality of page buffers PB1 to PBn, which may be configured similarly to each other.

The page buffer PB1 may operate in response to a signal, for example, output from the control logic 130 of FIG. 2. One or more signals SELBL, PB_SENSE, TRANSO, BL_DIS, SA_PRECH_N, SA_CSOC, SA_STB_N, SA_DISCH, PRECHSO_N, TRANT, TRST, TSET, TRANM, MRST, MSET, TRANTOF, TRANF, TRANS, SRST, SSET, and TRANPB described below may be included in the signal output from the control logic 130 of FIG. 2.

The page buffer PB1 may include a bit line connector 510, a bit line discharger 520, a page buffer sensor 530, a sensing node connector 540, a sensing node precharger 550, a cache latch component 560, a main latch component 570, a dynamic latch component 580, a latch detector 590, a current controller 610, a latch circuit 620, and a discharger 630.

The bit line connector 510 may be connected between the first bit line BL1 and a bit line connection node BLCM, and may include an NMOS transistor N1 operating in response to the bit line selection signal SELBL. The NMOS transistor N1 may be turned on or turned off in response to the bit line selection signal SELBL.

The bit line discharger 520 may be connected between a ground terminal and the bit line connection node BLCM, and may include an NMOS transistor N2 operating in response to the bit line discharge signal BL_DIS. The NMOS transistor N2 may be turned on or turned off in response to the bit line discharge signal BL_DIS. The bit line discharger 520 may discharge the first bit line BL1.

The page buffer sensor 530 may be connected between the bit line connection node BLCM and a current sensing node CSO, and may include an NMOS transistor N3 operating in response to the page buffer sensing signal PB_SENSE. The NMOS transistor N3 may be turned on or turned off in response to the page buffer sensing signal PB_SENSE.

According to the present embodiment, during the verify operation (among the operations included in the program loop), the page buffer sensing signal PB_SENSE applied to the NMOS transistor N3 may be adjusted according to a program order of the selected page among the plurality of pages. For example, a potential level of the page buffer sensing signal PB_SENSE applied to the NMOS transistor N3 may be adjusted to be higher as the program order of the selected page is later.

In addition, during the read operation, the potential level of the page buffer sensing signal PB_SENSE applied to the NMOS transistor N3 may be adjusted according to a position of the selected page among the plurality of pages. For example, the potential level of the page buffer sensing signal PB_SENSE applied to the NMOS transistor N3 may be adjusted to be lower as the position of the selected page is more adjacent to the drain select transistor, and may be adjusted to be higher as the position of the selected page is more adjacent to the source select transistor.

In addition, during the program verify operation or the read operation, an activation period of the page buffer sensing signal PB_SENSE applied to the NMOS transistor N3 may be adjusted. For example, during the program verify operation, the activation period of the page buffer sensing signal PB_SENSE applied to the NMOS transistor N3 may be adjusted according to the program order of the selected page. For example, during the program verify operation, the activation period of the page buffer sensing signal PB_SENSE applied to the NMOS transistor N3 may be increased as the program order of the selected page is later.

In addition, during the read operation, the activation period of the page buffer sensing signal PB_SENSE applied to the NMOS transistor N3 may be adjusted according to the position of the selected page. For example, during the read operation, the activation period of the page buffer sensing signal PB_SENSE applied to the NMOS transistor N3 may be decreased as the position of the selected page among the plurality of pages is more adjacent to the drain select transistor.

In addition, during a bit line precharge operation in the program verify operation, the potential level of the page buffer sensing signal PB_SENSE applied to the NMOS transistor N3 may be adjusted according to the program order of the selected page. In addition, during the bit line precharge operation in the program verify operation, the activation period of the page buffer sensing signal PB_SENSE applied to NMOS transistor N3 may be adjusted.

For example, during the bit line precharge operation in the program verify operation, the potential level of the page buffer sensing signal PB_SENSE applied to the NMOS transistor N3 may be adjusted to be higher as the program order of the selected page is late. In addition, the activation period of the page buffer sensing signal PB_SENSE applied to the NMOS transistor N3 may be increased as the program order of the selected page is later. At this time, the potential level and the activation period may be adjusted together.

In addition, during the bit line precharge operation in the read operation, the potential level of the page buffer sensing signal PB_SENSE applied to the NMOS transistor N3 may be adjusted according to the position of the selected page. In addition, during the bit line precharge operation in the read operation, the activation period of the page buffer sensing signal PB_SENSE applied to the NMOS transistor N3 may be adjusted. For example, the potential level of the page buffer sensing signal PB_SENSE applied to the NMOS transistor N3 may be adjusted to be lower as the position of the selected page is more adjacent to the drain select transistor, and may be adjusted to be higher as the position of the selected page is more adjacent to the source select transistor. In addition, the activation period of the page buffer sensing signal PB_SENSE applied to the NMOS transistor N3 may be decreased as the position of the selected page among the plurality of pages is adjacent to the drain select transistor. At this time, the potential level and the activation period may be adjusted together.

In addition, during the program verify operation or the read operation, the potential level of the page buffer sensing signal PB_SENSE applied to the NMOS transistor N3 may be adjusted according to a temperature of the memory cell array 110. For example, during the program verify operation or the read operation, the potential level of the page buffer sensing signal PB_SENSE applied to the NMOS transistor N3 may be adjusted to be higher as the temperature of the memory cell array 110 is decreased, and may be adjusted to be lower as the temperature of the memory cell array 110 is increased.

The sensing node connector 540 may be connected between the current sensing node CSO and a sensing node SO, and may include an NMOS transistor N4 operating in response to the node connection signal TRANSO. The NMOS transistor N4 may be turned on or turned off in response to the node connection signal TRANSO.

The sensing node precharger 550 may be connected between a core voltage VCORE terminal and the sensing node SO, and may include a PMOS transistor P1 operating in response to the precharge signal PRECHSO_N. The PMOS transistor P1 may be turned on or turned off in response to the precharge signal PRECHSO_N. When the PMOS transistor P1 is turned on in response to the precharge signal PRECHSO_N, the core voltage VCORE is supplied to the sensing node SO.

The cache latch component 560 may include NMOS transistors N5, N6, N9, and N10, a cache latch LATT, and a cache latch reset/setup component RSET. The cache latch component 560 may temporarily store program data.

The NMOS transistor N5 may be connected between the sensing node SO and the NMOS transistor N6, and may be turned on or turned off in response to the cache data transmission signal TRANT. The NMOS transistor N6 is connected between the NMOS transistor N5 and the ground terminal, and may be turned on or turned off in response to a potential level of a second cache node QT.

The cache latch LATT may include first and second inverters I1 and I2. The first and second inverters I1 and I2 may be connected in parallel with each other between first and second cache nodes QT_N and QT of the cache latch LATT. An input terminal of the first inverter I1 may be connected to the second cache node QT, and an output terminal may be connected to the first cache node QT_N. An input terminal of the second inverter I2 may be connected to the first cache node QT_N, and an output terminal may be connected to the second cache node QT.

The cache latch reset/setup component RSET may be connected to the first and second cache nodes QT_N and QT of the cache latch LATT, and may reset or set up the cache latch LATT. For example, the cache latch reset/setup component RSET may include NMOS transistors N7 and N8. The NMOS transistor N7 may connect the second cache node QT and a node COM1 of the cache latch LATT to each other in response to the cache reset signal TRST. The NMOS transistor N8 may connect the first cache node QT_N of the cache latch LATT and a node COM1 to each other in response to the cache setup signal TSET.

The NMOS transistor N9 may be connected between the node COM1 and the ground terminal, and may be turned on or turned off in response to a potential level of the sensing node SO. The NMOS transistor N10 may be connected between the sensing node SO and the ground terminal, and may be turned on or turned off in response to the page buffer data transmission signal TRANPB.

The main latch component 570 may include an NMOS transistor N13, a main latch LATM, and a main latch reset/setup component RSEM. The main latch component 570 may receive program data and determine an operation. For example, the main latch component 570 may determine one of the program, read, or erase operation.

The NMOS transistor N13 may connect the sensing node SO and a first main node QM_N of the main latch LATM to each other in response to the main data transmission signal TRANM.

The main latch LATM may include third and fourth inverters I3 and I4. The third and fourth inverters I3 and I4 may be connected in parallel with each other between the first and second main nodes QM_N and QM of the main latch LATM. An input terminal of the third inverter I3 may be connected to a second main node QM, and an output terminal may be connected to the first main node QM_N. An input terminal of the fourth inverter I4 may be connected to the first main node QM_N, and an output terminal may be connected to the second main node QM.

The main latch reset/setup component RSEM may be connected to the first and second main nodes QM_N and QM of the main latch LATM, and may reset or set up the main latch LATM. For example, the main latch reset/setup component RSEM may include NMOS transistors N11 and N12. The NMOS transistor N11 may connect the common node COM and the second main node QM of the main latch LATM to each other in response to the main reset signal MRST. The NMOS transistor N12 may connect the common node COM and the first main node QM_N of the main latch LATM to each other in response to the main setup signal MSET.

The dynamic latch component 580 may include NMOS transistors N14, N15, and N16. The dynamic latch component 580 may store program operation information. For example, the dynamic latch component 580 may store program operation information of any one of a multi-level cell (MLC), a triple level cell (TLC), and a quad level cell (QLC).

The NMOS transistor N14 may connect the first main node QM_N and a dynamic node QF to each other in response to the dynamic data transmission signal TRANTOF. The NMOS transistor N15 may be connected between the NMOS transistor N16 and the ground terminal, and may be turned on or turned off in response to a potential of the dynamic node QF. The NMOS transistor N16 may be connected between the sensing node SO and the NMOS transistor N15, and may be turned on or turned off in response to the dynamic data transmission signal TRANF.

The latch detector 590 may include NMOS transistors N17 and N18. When performing the program verify operation or the read operation on the plurality of memory cells, the latch detector 590 may detect states of the plurality of memory cells. The NMOS transistor N17 may be connected between a detection node LLN and the ground terminal, and may be turned on or turned off in response to a potential of a second sensing node QS of the latch circuit 620. The NMOS transistor N18 may be connected between the sensing node SO and the detection node LLN, and may be turned on or turned off in response to the detection data transmission signal TRANS.

The current controller 610 may include a clamp circuit 611, a current determination circuit 612, and a discharger 613. The clamp circuit 611 may include an NMOS transistor N19 and PMOS transistors P2 and P3. The PMOS transistor P2 may be connected between the core voltage VCORE terminal and a sense amplifier node SAN, and may be turned on or turned off in response to a potential of the second sensing node QS. The PMOS transistor P3 may be connected between the sense amplifier node SAN and the current sensing node CSO, and may transfer a current for precharging the first bit line BL1 to the current sensing node CSO in response to the current precharge signal SA_PRECH_N. The NMOS transistor N19 may be connected between the sense amplifier node SAN and the current sensing node CSO, and may generate a sensing current for sensing the first bit line BL1 in response to the current sensing signal SA_CSOC.

According to the present embodiment, during the program verify operation or the read operation, a method of adjusting the current sensing signal SA_CSOC applied to the NMOS transistor N19 may be performed similarly to the method of adjusting the page buffer sensing signal PB_SENSE applied to the NMOS transistor N3 described above.

The current determination circuit 612 may include PMOS transistors P4 and P5. The PMOS transistor P4 may be connected between the core voltage VCORE terminal and the PMOS transistor P5, and may be turned on or turned off in response to the sense amplifier strobe signal SA_STB_N.

According to the present embodiment, during the program verify operation or the read operation, an activation period of the sense amplifier strobe signal SA_STB_N applied to the PMOS transistor P4 may be adjusted to be increased or decreased. For example, during the program verify operation, the activation period of the sense amplifier strobe signal SA_STB_N applied to the PMOS transistor P4 may be adjusted to be increased or decreased according to the program order of the selected page. In addition, during the read operation, the activation period of the sense amplifier strobe signal SA_STB_N applied to the PMOS transistor P4 may be adjusted to be increased or decreased according to the position of the selected page among the plurality of pages.

In addition, the activation period of the sense amplifier strobe signal SA_STB_N applied to the PMOS transistor P4 may be adjusted to be increased or decreased according to the temperature of the memory cell array 110.

The PMOS transistor P5 may be connected between the PMOS transistor P4 and the second sensing node QS, and may be turned on or turned off in response to a potential level of the current sensing node CSO.

The discharger 613 may be connected between the current sensing node CSO and the detection node LLN, and may include an NMOS transistor N20 operating in response to the sense amplifier discharge signal SA_DISCH. The NMOS transistor N20 may be turned on or turned off in response to the sense amplifier discharge signal SA_DISCH. The discharger 613 may discharge the current sensing node CSO.

The latch circuit 620 may include a sensing latch LATS and a sensing latch reset/setup component RSES. The sensing latch LATS may include fifth and sixth inverters I5 and I6. The fifth and sixth inverters I5 and I6 may be connected in parallel with each other between first and second sensing nodes QS_N and QS of the sensing latch LATS. For example, an input terminal of the fifth inverter I5 may be connected to the second sensing node QS, and an output terminal may be connected to the first sensing node QS_N. An input terminal of the sixth inverter I6 may be connected to the first sensing node QS_N, and an output terminal may be connected to the second sensing node QS.

The sensing latch reset/setup component RSES may be connected to the first and second sensing nodes QS_N and QS of the sensing latch LATS, and may reset or set up the sensing latch LATS. For example, the sensing latch reset/setup component RSES may include NMOS transistors N21 and N22. The NMOS transistor N21 may connect the common node COM and the second sensing node QS of the sensing latch LATS to each other in response to the sensing reset signal SRST. The NMOS transistor N22 may connect the common node COM and the first sensing node QS_N of the sensing latch LATS to each other in response to the sensing setup signal SSET.

The discharger 630 may be connected between the common node COM and the ground terminal, and may include an NMOS transistor N23 turned on or turned off according to the potential of the sensing node SO.

FIGS. 5A to 5C illustrate an embodiment of a method of sensing a plurality of logical pages included in one page, and particularly a method of reading a selected page when the memory device 100 of FIG. 1 performs the program operation in the TLC method. In FIGS. 5A to 5C, the horizontal axis indicates a magnitude Vth of a threshold voltage of the memory cells and the vertical axis indicates the number of memory cells. Additionally, FIGS. 5A to 5C indicate a threshold voltage distribution of the memory cells when the memory device 100 of FIG. 1 performs the program operation in the TLC method.

In an embodiment, when the memory device 100 of FIG. 1 performs the program operation in the TLC method, the memory cells may have any one of an erase state E and first to seventh program states PV1 to PV7. A voltage for distinguishing between the erase state E and the first program state PV1 may be a first read voltage R1. A voltage for distinguishing between the first program state PV1 and the second program state PV2 may be a second read voltage R2. A voltage for distinguishing between the second program state PV2 and the third program state PV3 may be a third read voltage R3. A voltage for distinguishing between the third program state PV3 and the fourth program state PV4 may be a fourth read voltage R4. A voltage for distinguishing between the fourth program state PV4 and the fifth program state PV5 may be a fifth read voltage R5. A voltage for distinguishing between the fifth program state PV5 and the sixth program state PV6 may be a sixth read voltage R6. A voltage for distinguishing between the sixth program state PV6 and the seventh program state PV7 may be a seventh read voltage R7.

In FIGS. 5A to 5C, since it is assumed that the memory device 100 of FIG. 1 performs a program operation in the TLC method, each of the plurality of pages in the memory device 100 of FIG. 1 may include three logical pages. For example, each of the plurality of pages included in the memory device 100 of FIG. 1 may include a least significant bit (LSB) page, a center significant bit (CSB) page, and a most significant bit (MSB) page. (In one embodiment, FIGS. 5A to 5C may be applied to a case where the memory device 100 of FIG. 1 performs the program operation in an SLC method, MLC method, or QLC method.)

FIG. 5A shows a case where the LSB page is read. The LSB page may be read by first and second read operations, e.g., two read operations. In an embodiment, the memory device 100 of FIG. 1 may first perform the first read operation using the fifth read voltage R5 of the first and fifth read voltages R1 and R5. For example, during the read operation on the LSB page, the memory device 100 of FIG. 1 may first perform the first read operation with the fifth read voltage R5, and then may perform the second read operation with the first read voltage R1 which is lower than the fifth read voltage R5. This may be referred to as a reverse read operation.

When the memory device 100 of FIG. 1 performs the first and second read operations, the memory cell of the erase state of may read as '1', the memory cell of the first to fourth program states PV1 to PV4 may be read as '0', and the memory cell of the fifth to seventh program states PV5 to PV7 may be read as '1'.

FIG. 5B shows a case where the CSB page is read. The CSB page may be read by third to fifth read operations, e.g., three read operations. In an embodiment, the memory device 100 of FIG. 1 may first perform the third read operation with the sixth read voltage R6 among the second, fourth, and sixth read voltages R2, R4, and R6.

For example, during the read operation on the CSB page, after the memory device 100 of FIG. 1 first performs the third read operation with the sixth read voltage R6, the memory device 100 of FIG. 1 may sequentially perform the fourth read operation with the fourth read voltage R4 of a level lower than that of the sixth read voltage R6, and the fifth read operation with the second read voltage R2 of a level lower than that of the fourth read voltage R4. Similarly to the read method for the LSB page, the read operation as described above may be referred to as a reverse read operation.

When the memory device 100 of FIG. 1 performs the third to fifth read operations, the memory cell of the erase state and the first program state PV1 may be read as '1', the memory cell of the second and third program states PV2 and PV3 may be read as '0.' The memory cell of the fourth and fifth program states PV4 and PV5 may be read as '1', and the memory cell of the sixth and seventh program states PV6 and PV7 may be read as '0'.

FIG. 5C shows a case where the MSB page is read. The MSB page may be read by sixth and seventh read operations, e.g., two read operations. In an embodiment, the memory device 100 of FIG. 1 may first perform the sixth read operation with the seventh read voltage R7 of the third and seventh read voltages R3 and R7.

For example, during the read operation on the MSB page, the memory device 100 of FIG. 1 may first perform the sixth read operation with the seventh read voltage R7 and then may perform the seventh read operation with the third read voltage R3 of a level lower than that of the seventh read voltage R7. Similarly to the read method on the LSB page, the read operation as described above may be referred to as a reverse read operation.

When the memory device 100 of FIG. 1 performs the sixth and seventh read operations, the memory cell of the erase state and the first and second program states PV1 and PV2 may be read as '1'. The memory cell of the third to sixth program states PV3 to PV6 may be read as '0.' The memory cell of the seventh program state PV7 may be read as '1'.

However, in a case where the plurality of logical pages are read by a reverse read operation as described above, the number of flipped latches in the page buffer may be increased when reading with a read voltage of a low level. When the number of flipped latches is increased, noise may increase during the read operation.

Therefore, in the present embodiment, the method is implemented to decrease the number of flipped latches based on a result of reading with a read voltage of a high level. As a result, an increase of noise may be prevented during the read operation.

FIG. 6 illustrates an embodiment of a method of sensing an LSB page. Referring to FIGS. 4 to 6, FIG. 6 shows a process in which the LSB page is sensed. In the present drawing, it is assumed that the sensing operation is the read operation. In another embodiment, the sensing operation may be the program verify operation.

In an embodiment, when the LSB page is sensed, a default value of the QS_N node may be set as '1' and a default value of the QM_N node may be set as '0'.

In an embodiment, the memory device 100 of FIG. 1 may perform the first read operation with the fifth read voltage R5. During the first read operation with the fifth read voltage R5, a value of the QM_N node may be maintained or changed. For example, during the first read operation, the memory cells of the erase state and the first to fourth program states PV1 to PV4 having a threshold voltage lower than the fifth read voltage R5 may be maintained as '0' which is the default value. The memory cells of the fifth to seventh program states PV5 to PV7 (having a threshold voltage higher than the fifth read voltage R5) may be changed from '0' which is the default value to '1'.

According to a reverse read operation, the memory device 100 of FIG. 1 may perform the first read operation with the fifth read voltage R5 and then may perform the second read operation with the first read voltage R1 of a level lower than that of the fifth read voltage R5. During the second read operation with the first read voltage R1, a value of the QS_N node may be maintained or changed. For example, during the second read operation, the memory cells of the erase state (having a threshold voltage lower than the first read voltage R1) may be maintained as '1' which is the default value. The memory cells of the first to seventh program states PV1 to PV7 (having a threshold voltage higher than first read voltage R1) may be changed from '1' which is the default value to '0'.

Thereafter, the memory device 100 of FIG. 1 may move the value of the QM_N node to the QS_N node. For example, the value of the latch flipped during the first read operation may be moved to the QS_N node. In one embodiment, the memory device 100 of FIG. 1 may again flip values corresponding to the fifth to seventh program states PV5 to PV7 flipped during the first read operation, among the values of the QS_N node.

As a result, data of the LSB page may be sensed to the QS_N node. However, since the latches corresponding to the first to seventh program states PV1 to PV7 are flipped during the second read operation performed with the first read voltage R1 of a lower level than that of the fifth read voltage R5, a large number of latches may be flipped. As a result, noise may occur in the read operation.

In the present embodiment, when only latches corresponding to the first to fourth program states PV1 to PV4 are flipped (by masking a result of the first read operation performed with the fifth read voltage R5 on the sensing node), noise generated during the read operation may be reduced. The above-described read method is described with reference to the following descriptions.

FIG. 7 shows example values of a sensing node when sensing an LSB page, and more particularly the value of the sensing node SO when the second read operation is performed with the first read voltage R1 in a process of sensing the LSB page. In the present drawing, it is assumed that the sensing operation is the read operation. In another embodiment, the sensing operation may be the program verify operation.

Differently from FIG. 6, when the LSB page is sensed, a default value of both of the QS_N node and the QM_N node may be set as '1'.

In an embodiment, the memory device 100 of FIG. 1 may perform the first read operation with the fifth read voltage R5. During the first read operation with the fifth read voltage R5, the value of the QM_N node may be maintained or changed. For example, during the first read operation, the memory cells of the erase state and the first to fourth program states PV1 to PV4 (having a threshold voltage lower than the fifth read voltage R5) may be maintained as '1,' which is the default value. The memory cells of the fifth to seventh program states PV5 to PV7 (having a threshold voltage higher than the fifth read voltage R5) may be changed from '1' which is the default value to '0'.

According to the reverse read operation, the memory device 100 of FIG. 1 may perform the first read operation with the fifth read voltage R5 and then may perform the second read operation with the first read voltage R1 of a level lower than that of the fifth read voltage R5. During the second read operation with the first read voltage R1, a value of the QS_N node may be maintained or changed.

In an embodiment, before the value of the QS_N node is maintained or changed, data sensed through the first bit line BL1 may be read to the sensing node SO. An operation of reading data to the sensing node SO may be, for example, an evaluation operation. During the evaluation operation, when the memory cells of the erase state (having the threshold voltage lower than the first read voltage R1) are read, the value of the sensing node SO may become '0'. When the memory cells of the first to seventh program states PV1 to PV7 (having the threshold voltage higher than the first read voltage R1) are read, the value of the sensing node SO may become '1'.

When the value of the sensing node SO is set according to the evaluation operation, the value of the QS_N node may be maintained or changed based on the value of the sensing node SO. For example, during the second read operation, when the value of the sensing node SO is '0', the value of the QS_N node may be maintained as '1' which is the default value. When the value of the sensing node SO is '1', the value of the QS_N node may be changed from '1' which is the default value to '0'.

However, when the value of the QS_N node is set according to the value of the sensing node SO, a large number of latches are flipped because the latches corresponding to the first to seventh program states PV1 to PV7 are flipped. Thus, noise may occur in the read operation.

Therefore, during the second read operation, a masking operation may be performed on the sensing node SO after the evaluation operation, so that only latches corresponding to the first to fourth program states PV1 to PV4 are flipped.

Figure 8:
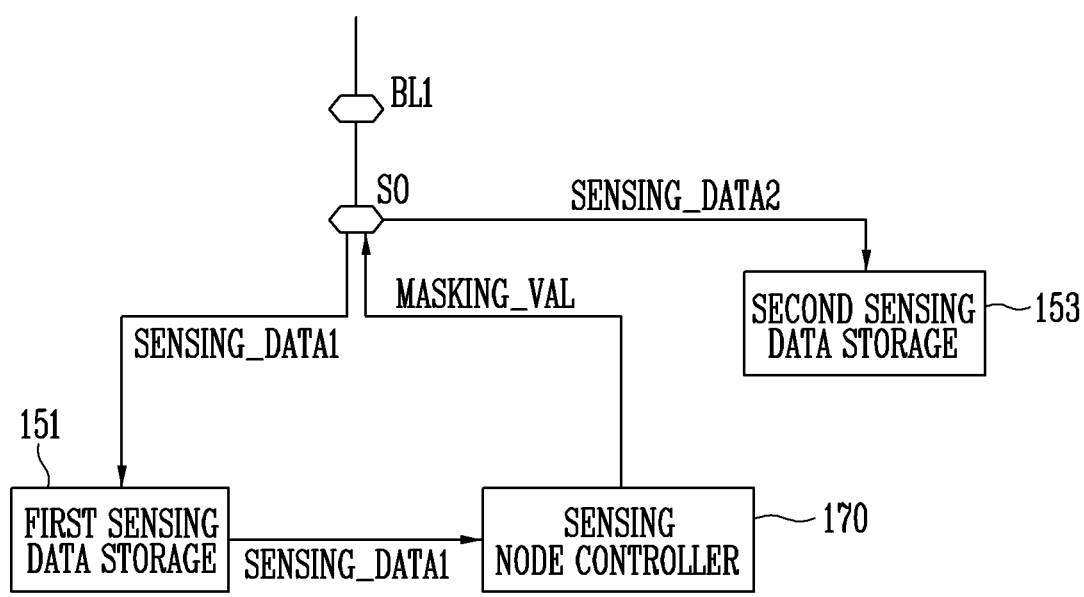
FIG. 8 illustrates an example configuration of a memory device for masking a sensing node.

FIG. 8 is a diagram illustrating a configuration of a memory device for masking a sensing node. In particular, FIG. 8 shows the first bit line BL1 connected to the sensed memory cell and the sensing node SO connected to the first bit line BL1, and also shows first and second sensing data storages 151 and 153 and the sensing node controller 170. In an embodiment, each of the first and second sensing data storages 151 and 153 may be any one of the latches of FIG. 4. Herein, referring to FIG. 3, the sensed memory cell is one of memory cells coupled to the first bit line BL1.

Referring to FIGS. 7 and 8, it is assumed that the memory device 100 of FIG. 1 senses the LSB page among the logical pages of the page in which the sensed memory cell is included. The LSB page may be read by the first read operation (performed with the fifth read voltage R5) and the second read operation (performed with the first read voltage R1 of the level lower than that of the fifth read voltage R5).

In an embodiment, during the first read operation, the potential of the sensing node SO may be changed according to the magnitude of the threshold voltage of the memory cell sensed through the first bit line BL1. For example, when the threshold voltage of the sensed memory cell is less than the fifth read voltage R5, the potential of the sensing node SO may be decreased to a value adjacent to a ground voltage level. When the threshold voltage of the sensed memory cell is greater than the fifth read voltage R5, the potential of the sensing node SO may be decreased to a value adjacent to a precharge level. An operation in which the potential of the sensing node SO is changed may be an evaluation operation.

In an embodiment, the potential of the sensing node SO may be changed according to the first read operation, and first sensing data SENSING_DATA1 according to the potential of the sensing node SO may be transferred to the first sensing data storage 151. The latches in first sensing data storage 151 may or may not be flipped according to the first sensing data SENSING_DATA1.

For example, the latch may not be flipped when the value of the sensing node SO is '0' (when the value of the sensing node SO is decreased to the value adjacent to the ground voltage level). The latch may be flipped when the value of the sensing node SO is '1' (when the value of the sensing node SO is decreased to the value adjacent to the precharge level).

Thereafter, the second read operation may be performed with the first read voltage R1, which has a level lower than the level of the fifth read voltage R5. Similarly to the first read operation, during the second read operation, the potential of the sensing node SO may be changed according to the magnitude of the threshold voltage of the memory cell sensed through the first bit line BL1.

For example, when the threshold voltage of the sensed memory cell is less than the first read voltage R1, the potential of the sensing node SO may be decreased to a value adjacent to the ground voltage level. When the threshold voltage of the sensed memory cell is greater than the first read voltage R1, the potential of the sensing node SO may be decreased to a value adjacent to the precharge level. An operation in which the potential of the sensing node SO is changed may be, for example, an evaluation operation.

In the present embodiment, during the evaluation operation according to the second read operation, sensing node controller 170 may receive the first sensing data SENSING_DATA1 from the first sensing data storage 151 and may output a masking value MASKING_VAL based on the first sensing data SENSING_DATA1. The masking value MASKING_VAL may be transferred to the sensing node SO through an output of the sensing node controller 170 (e.g., a port or output pin of a chip that includes the sensing node controller 170, whether implemented in software, hardware, or a combination of the two), which output may be coupled to the signal line carrying the masking value MASKING_VAL to the sensing node SO.

For example, the sensing node controller 170 may output '0' (among the first sensing data SENSING DATA1 received from the first sensing data storage 151) to the sensing node SO as the masking value MASKING_VAL of sensing data corresponding to the fifth to seventh program states PV5 to PV7. The sensing node SO may set the value of the sensing node SO according to the masking value MASKING_VAL output from the sensing node controller 170. When the masking operation is performed, the value of the sensing node SO may be set regardless of data sensed by the evaluation operation.

Thereafter, second sensing data SENSING_DATA2 (sensed to the sensing node SO on which the masking value MASKING_VAL is reflected) may be transferred to the second sensing data storage 153. The latches in the second sensing data storage 153 may or may not be flipped according to the second sensing data SENSING_DATA2. For example, the latch may not be flipped when the value of the sensing node SO is '0' (when the value of the sensing node SO is decreased to the value adjacent to the ground voltage level). The latch may be flipped when the value of the sensing node SO is '1' (when the value of the sensing node SO is decreased to the value adjacent to the precharge level).

Through the masking operation described above, the latches corresponding to the first to fourth program states PV1 to PV4 (among the latches corresponding to the first to seventh program states PV1 to PV7) may be flipped during the second read operation performed with the first read voltage R1. As a result, the number of flipped latches may be decreased and thus the amount of noise generated during the read operation may be reduced.

Figure 9:
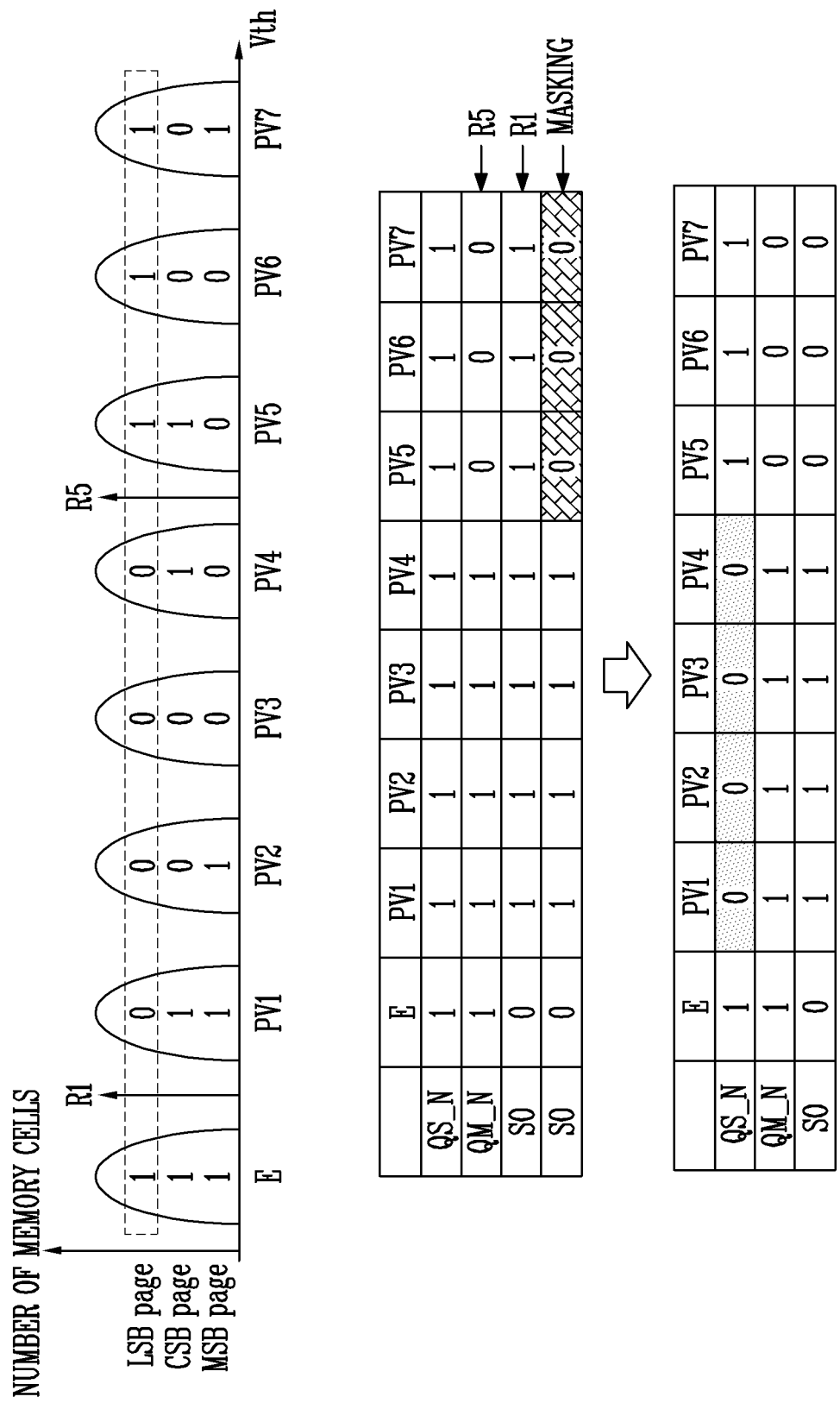
FIG. 9 illustrates an embodiment of a method of masking and sensing data sensed during an evaluation operation.

FIG. 9 is a diagram illustrating an embodiment of a method of masking and sensing data sensed during an evaluation operation. In particular, FIG. 9 shows a process in which the value of the sensing node SO is masked according to the masking value of FIG. 8 and the sensing operation is performed based on the masked sensing data. In the drawing, it is assumed that the sensing operation is the read operation. In another embodiment, the sensing operation may be the program verify operation.

Referring to FIG. 9, when the LSB page is sensed, a default value of both of the QS_N node and the QM_N node may be set as '1'.

In an embodiment, the memory device 100 of FIG. 1 may perform the first read operation with the fifth read voltage R5. During the first read operation with the fifth read voltage R5, a value of the QM_N node may be maintained or changed. For example, during the first read operation, the memory cells of the erase state and the first to fourth program states PV1 to PV4 (having a threshold voltage lower than the fifth read voltage R5) may be maintained as '1,' which is the default value. The memory cells of the fifth to seventh program states PV5 to PV7 (having a threshold voltage higher than the fifth read voltage R5) may be changed from '1' which is the default value to '0'.

Thereafter, the memory device 100 of FIG. 1 may perform the second read operation with the first read voltage R1 having the level lower than the level of the fifth read voltage R5. During the second read operation with the first read voltage R1, the evaluation operation may be performed in which the data sensed through the first bit line BL1 is read to the sensing node SO.

During the evaluation operation, the value of the sensing node SO may become '0' when the memory cells of the erase state having the threshold voltage lower than the first read voltage R1 are read. The value of the sensing node SO may become '1' when the memory cells of the first to seventh program states PV1 to PV7 having the threshold voltage higher than the first read voltage R1 are read.

At this time, the memory device 100 of FIG. 1 may mask the value of the sensing node SO based on the data sensed with the fifth read voltage R5 (MASKING). For example, the value of the sensing node SO may be set based on the masking value MASKING_VAL output from the sensing node controller 170 of FIG. 8. When the masking operation is performed, the value of the sensing node SO may be set regardless of the data sensed by the evaluation operation.

For example, the sensing node controller 170 of FIG. 8 may output '0' as the masking value MASKING_VAL of sensing data corresponding to the fifth to seventh program states PV5 to PV7. When the masking value MASKING_VAL is output to the sensing node SO, data may be output as the sensing data in correspondence with the masking value MASKING_VAL reflected on the sensing node SO.

Thereafter, the value of the QS_N node may be set based on the sensing data output from the sensing node SO. For example, when the value of the sensing node SO is '0', the value of the QS_N node may be maintained as '1' which is the default value. When the value of the sensing node SO is '1', the value of the QS_N node may be changed from '1' which is the default value to '0'.

As a result, only the latches corresponding to the first to fourth program states PV1 to PV4 (in which the value of the sensing node SO is '1') may be flipped, and thus the number of flipped latches may be decreased. For example, the number of flipped latches may be decreased in a process in which data is stored in the latch. Therefore, noise generated during the sensing operation may be reduced.

Figure 10:
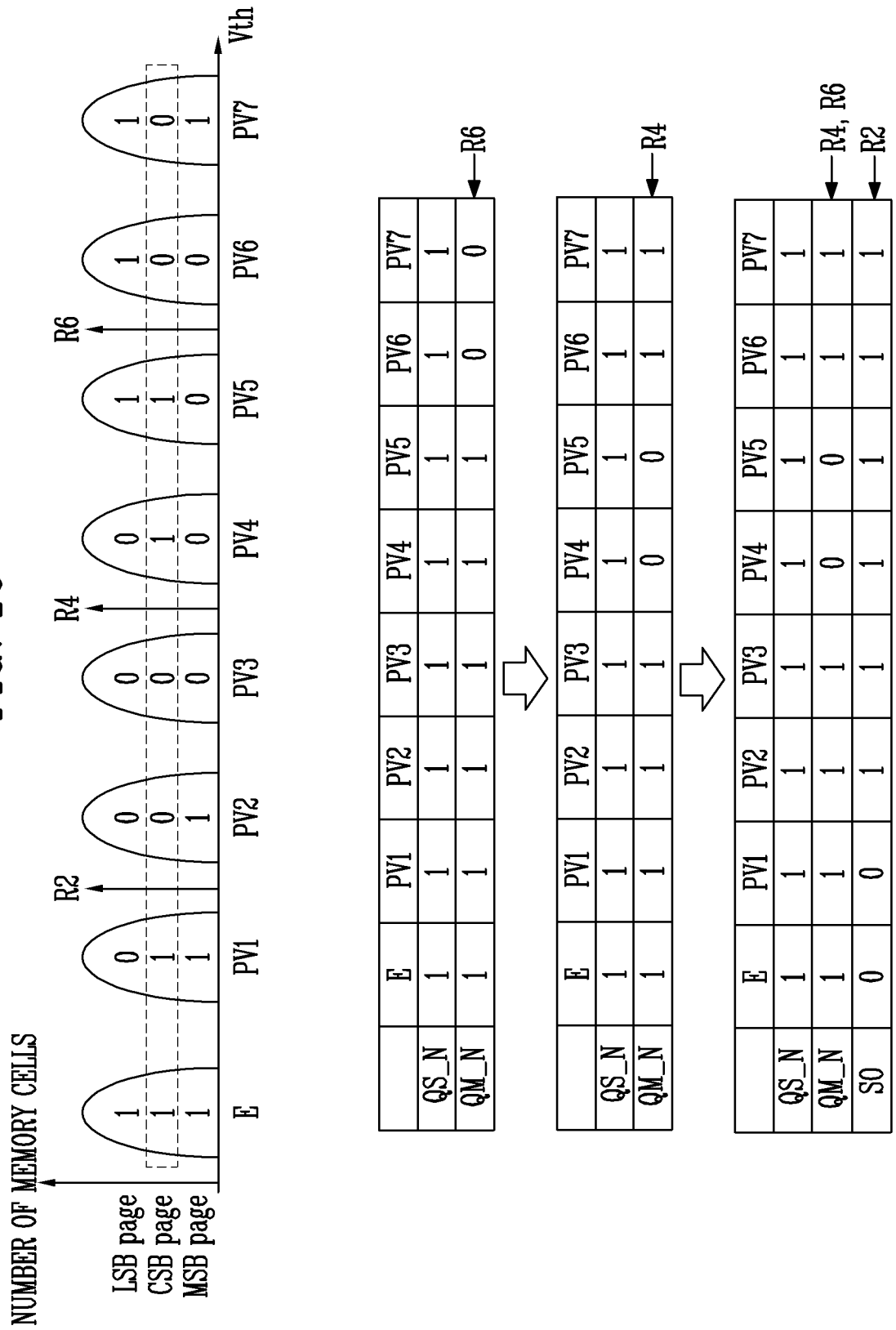
FIG. 10 illustrates an embodiment of a method of sensing a center significant bit (CSB) page.

FIG. 10 illustrates an embodiment of a method of sensing a CSB page. In particular, FIG. 10 shows a process in which a third read operation is performed with the sixth read voltage R6, a fourth read operation is performed with the fourth read voltage R4, and a fifth read operation is performed with the second read voltage R2, during a process in which the CSB page is sensed. In the present drawing, it is assumed that the sensing operation is the read operation. In another embodiment, the sensing operation may be the program verify operation.

Referring to FIG. 10, a default value of both of the QS_N node and the QM_N node may be set as '1' when the CSB page is sensed.

In an embodiment, the memory device 100 of FIG. 1 may perform the third read operation with the sixth read voltage R6. During the third read operation with the sixth read voltage R6, the value of the QM_N node may be maintained or changed. For example, during the third read operation, the memory cells of the erase state and the first to fifth program states PV1 to PV5 (having a threshold voltage lower than the sixth read voltage R6) may be maintained as '1,' which is the default value. The memory cells of the sixth and seventh program states PV6 and PV7 (having a threshold voltage higher than the sixth read voltage R6) may be changed from '1,' which is the default value, to '0'.

Thereafter, the memory device 100 of FIG. 1 may perform the fourth read operation with the fourth read voltage R4. During the fourth read operation with the fourth read voltage R4, the value of the QM_N node may be maintained or changed. For example, during the fourth read operation, the memory cells of the erase state and the first to third program states PV1 to PV3 (having a threshold voltage lower than the fourth read voltage R4) may be maintained as '1,' which is the default value. Also, the memory cells of the fourth and fifth program states PV4 and PV5 (having a threshold voltage higher than the fourth read voltage R4) may be changed from '1,' which is the default value, to '0.' Additionally, the memory cells of the sixth and seventh program states PV6 and PV7 may be changed from '0' to '1'.

Thereafter, the memory device 100 of FIG. 1 may perform the fifth read operation with the second read voltage R2. The value of the QS_N node may be maintained or changed according to a performance result of the fifth read operation.

In an embodiment, data sensed through the first bit line BL1 may be read to the sensing node SO before the value of the QS_N node is maintained or changed. An operation of reading data to the sensing node SO may be, for example, an evaluation operation.

During the evaluation operation, when the memory cells of the erase state and the first program state (having the threshold voltage lower than the second read voltage R2) are read, the value of the sensing node SO may become '0'. When the memory cells of the second to seventh program states PV2 to PV7 (having the threshold voltage higher than the second read voltage R2) are read, the value of the sensing node SO may become '1'.

When the value of the sensing node SO is set according to the evaluation operation, the value of the QS_N node may be maintained or changed based on the value of the sensing node SO. For example, when the value of the sensing node SO is '0' during the fifth read operation, the value of the QS_N node may be maintained as '1,' which is the default value. When the value of the sensing node SO is '1', the value of the QS_N node may be changed from '1' which is the default value to '0'.

However, when the value of the QS_N node is set according to the value of the sensing node SO, the latches corresponding to the second to seventh program states PV2 to PV7 are flipped, and thus a large number of latches are flipped. As a result, noise may occur in the read operation.

Therefore, during the fifth read operation, a masking operation may be performed on the sensing node SO after the evaluation operation. As a result, only latches corresponding to the second and third program states PV2 and PV3 and the sixth and seventh program states PV6 and PV7 are flipped.

Figure 11:
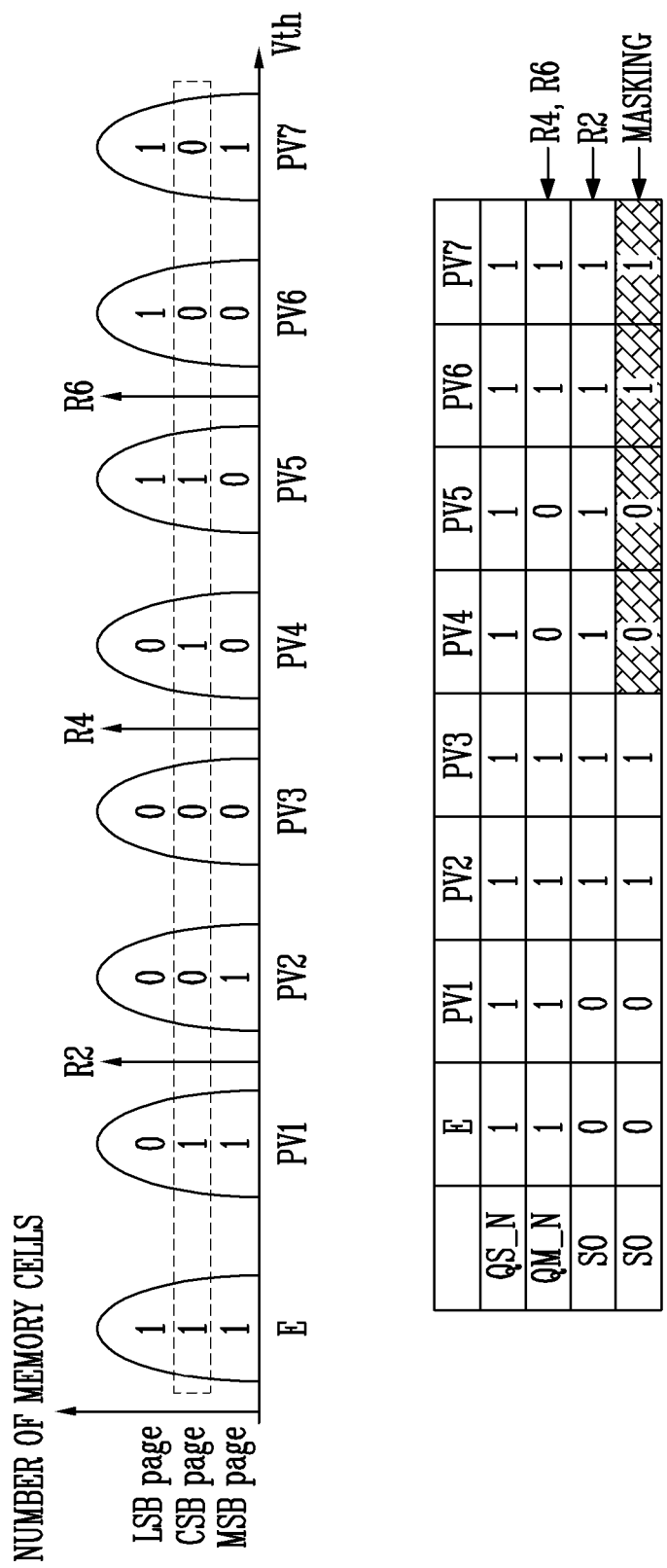
FIG. 11 illustrates an embodiment in which a CSB page is sensed using masking.

FIG. 11 illustrates an embodiment in which a CSB page is sensed using masking. In particular, FIG. 11 shows a process in which the value of the sensing node SO is masked according to a masking value and the sensing operation is performed based on the masked sensing data, during the sensing operation on the CSB page. In the present drawing, content repetitive to that of FIG. 10 is omitted.

In an embodiment, the memory device 100 of FIG. 1 may perform the third read operation with the sixth read voltage R6 and the fourth read operation with the fourth read voltage R4. As a result of performing the third and fourth read operations, the value of the QM_N node of the memory cells of the erase state and the first to third program states PV1 to PV3 may be maintained as '1,' which is the default value. Also, the value of the QM_N node of the memory cells of the fourth and fifth program states PV4 and PV5 may be changed from '1,' which is the default value, to '0', and the value of the QM_N node of the memory cells of the sixth and seventh program states PV6 and PV7 may be changed from '0' to '1'.

Thereafter, the memory device 100 of FIG. 1 may perform the fifth read operation with the second read voltage R2. During the fifth read operation, the evaluation operation may be performed in which the data sensed through the first bit line BL1 is read to the sensing node SO.

During the evaluation operation, when the memory cells of the erase state and the first program state PV1 (having the threshold voltage lower than the second read voltage R2) are read, the value of the sensing node SO may become '0'. When the memory cells of the second to seventh program states PV2 to PV7 (having the threshold voltage higher than the second read voltage R2) are read, the value of the sensing node SO may become '1'.

At this time, the memory device 100 of FIG. 1 may mask the value of the sensing node SO according to the value of the QM_N node, set based on a result of performing the third and fourth read operations (MASKING). That is, the value of sensing node SO may be set based on the masking value MASKING_VAL output from the sensing node controller 170 of FIG. 8. When the masking operation is performed, the value of the sensing node SO may be set regardless of the data sensed by the evaluation operation.

For example, the sensing node controller 170 of FIG. 8 may output to the sensing node SO a value of '0' as the masking value MASKING_VAL of sensing data corresponding to the fourth and fifth program states PV4 and PV5, and may output a value of '1' as the masking value MASKING_VAL of sensing data corresponding to the sixth and seventh program states PV6 and PV7. When the masking value MASKING_VAL is output to the sensing node SO, data in which the masking value MASKING_VAL is reflected on the sensing node SO may be output as the sensing data.

Thereafter, the value of the QS_N node may be set based on the sensing data output from the sensing node SO. For example, when the value of the sensing node SO is '0', the value of the QS_N node may be maintained as '1,' which is the default value. When the value of the sensing node SO is '1', the value of the QS_N node may be changed from '1,' which is the default value, to '0'.

As a result, only latches corresponding to the second and third program states PV2 and PV3 and the sixth and seventh program states PV6 and PV7 in which the value of the sensing node SO is '1,' may be flipped. Accordingly, the number of flipped latches may be decreased, e.g., the number of flipped latches may be decreased in a process in which data is stored in the latch. Therefore, noise generated during the sensing operation may be reduced.

Figure 12:
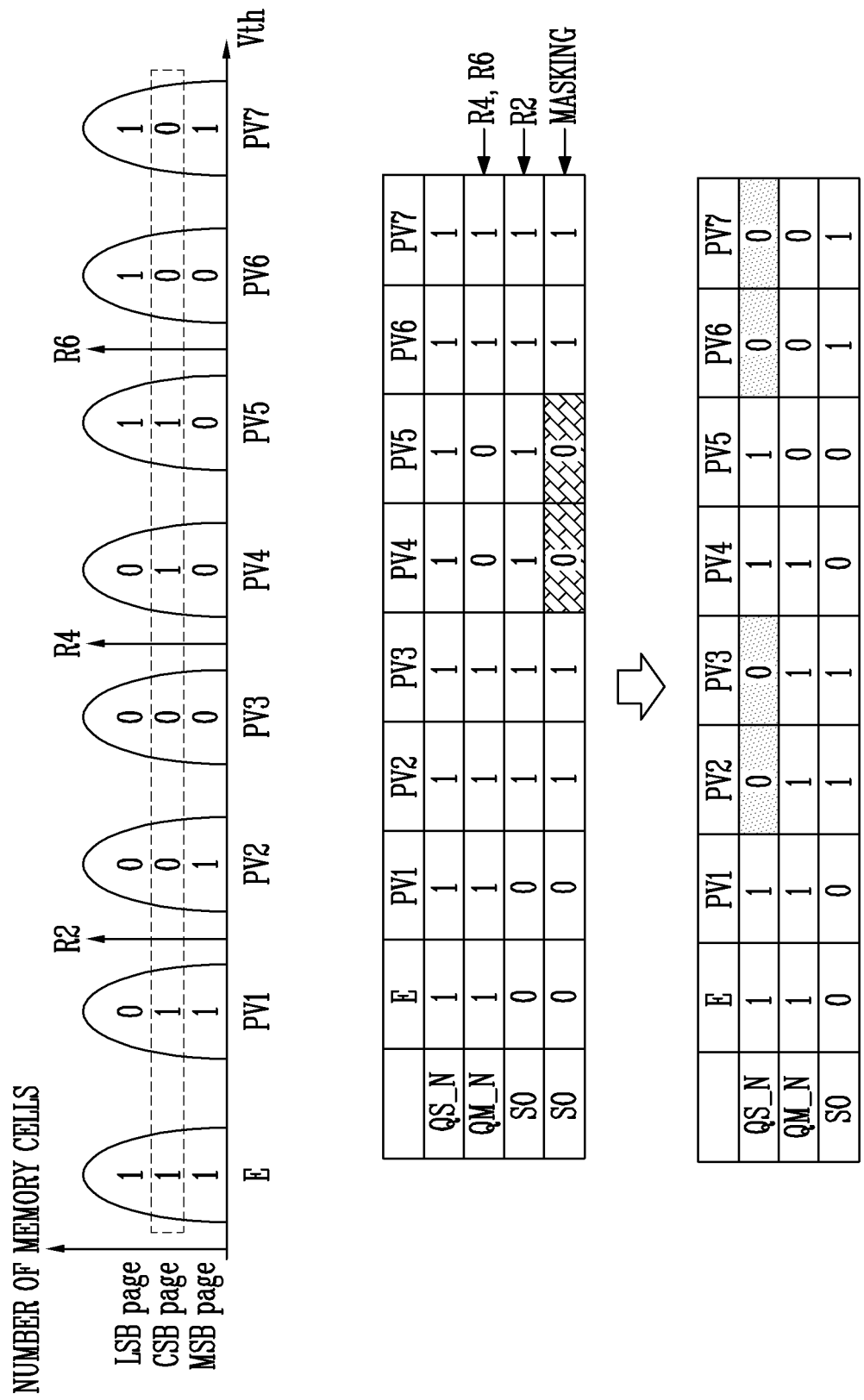
FIG. 12 illustrates an embodiment of sensing a CSB page using masking.

FIG. 12 illustrates an embodiment in which a CSB page is sensed using masking. In particular, FIG. 12 shows a process in which the value of the sensing node SO is masked according to a masking value set in a method different from that of FIG. 11, and the sensing operation is performed based on the masked sensing data, during the sensing operation on the CSB page. In the present drawing, content repetitive to that of FIG. 11 is omitted.

In an embodiment, after the memory device 100 of FIG. 1 performs the third read operation with the sixth read voltage R6 and the fourth read operation with the fourth read voltage R4, the memory device 100 of FIG. 1 may perform the fifth read operation with the second read voltage R2. During the fifth read operation, the evaluation operation may be performed in which the data sensed through the first bit line BL1 is read to the sensing node SO.

In an embodiment, the memory device 100 of FIG. 1 may mask the value of the sensing node SO according to the value of the QM_N node, set based on a result of performing the third and fourth read operations (MASKING). That is, the value of the sensing node SO may be set based on the masking value MASKING_VAL output from sensing node controller 170 of FIG. 8.

Differently from FIG. 11, the sensing node controller 170 of FIG. 8 may output to the sensing node SO a value of '0' as the masking value MASKING_VAL of sensing data corresponding to the fourth and fifth program states PV4 and PV5. That is, the masking value MASKING_VAL of sensing data corresponding to the sixth and seventh program states PV6 and PV7 may not be set. In an embodiment, since the sensing data corresponding to the sixth and seventh program states PV6 and PV7 is read as '1' to the sensing node SO, the masking value MASKING_VAL of the sensing data may not be set.

Thereafter, the value of the QS_N node may be set based on the sensing data output from the sensing node SO. For example, when the value of the sensing node SO is '0', the value of the QS_N node may be maintained as '1,' which is the default value. When the value of the sensing node SO is '1', the value of the QS_N node may be changed from '1,' which is the default value, to '0'.

As a result, only the latches corresponding to the second and third program states PV2 and PV3 and the sixth and seventh program states PV6 and PV7 in which the value of the sensing node SO is '1,' may be flipped. Accordingly, the number of flipped latches may be decreased, e.g., the number of flipped latches may be decreased in a process in which data is stored in the latch. Therefore, noise generated during the sensing operation may be reduced.

Figure 13:
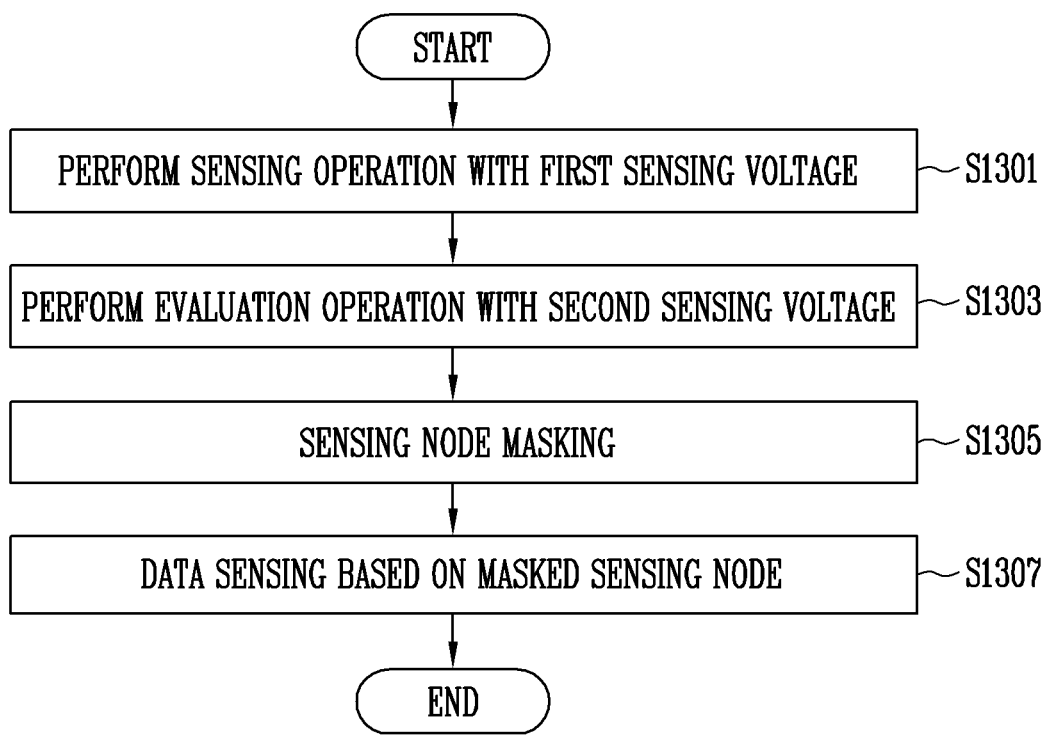
FIG. 13 illustrates an embodiment of operating a memory device.

FIG. 13 is a diagram illustrating an operation of a memory device according to an embodiment. Referring to FIG. 13, in operation S1301, the memory device may perform the sensing operation with the first sensing voltage. The sensing operation may be, for example, the program verify operation included in the program loop or a read operation.

In an embodiment, during the sensing operation, the sensing operation may be performed on any one of the logical pages in the selected page. The sensing operation on one logical page may be performed through a plurality of sensing operations. In operation S1301, the sensing operation performed with the first sensing voltage may be a sensing operation performed first among the plurality of sensing operations. In the present embodiment, it is assumed that the sensing operation on the logical page is performed by the first and second sensing operations.

In operation S1303, the memory device may perform the evaluation operation with the second sensing voltage. The second sensing voltage may be, for example, a voltage of a level lower than that of the first sensing voltage. Also, the evaluation operation may correspond to one in which data sensed with the second sensing voltage is sensed to the sensing node through the bit line.

In an embodiment, when data is stored in the latch based on the data sensed to the sensing node, a plurality of latches may be flipped. Therefore, in operation S1305, the masking operation may be performed.

In operation S1305, the memory device may mask the sensing node. For example, the masking operation may be performed with the value of the sensing node corresponding to the flipped latches, among the data sensed during the first sensing operation. When the masking operation is performed, the value of the sensing node may be set regardless of the data sensed by the evaluation operation.

In operation S1307, the memory device may sense the data based on the masked sensing node. For example, when the value of the sensing node is '0', the sensed data may be maintained as '1' which is the default value. When the value of the sensing node is '1', the sensed data may be changed from '1' which is the default value to '0'.

Figure 14:
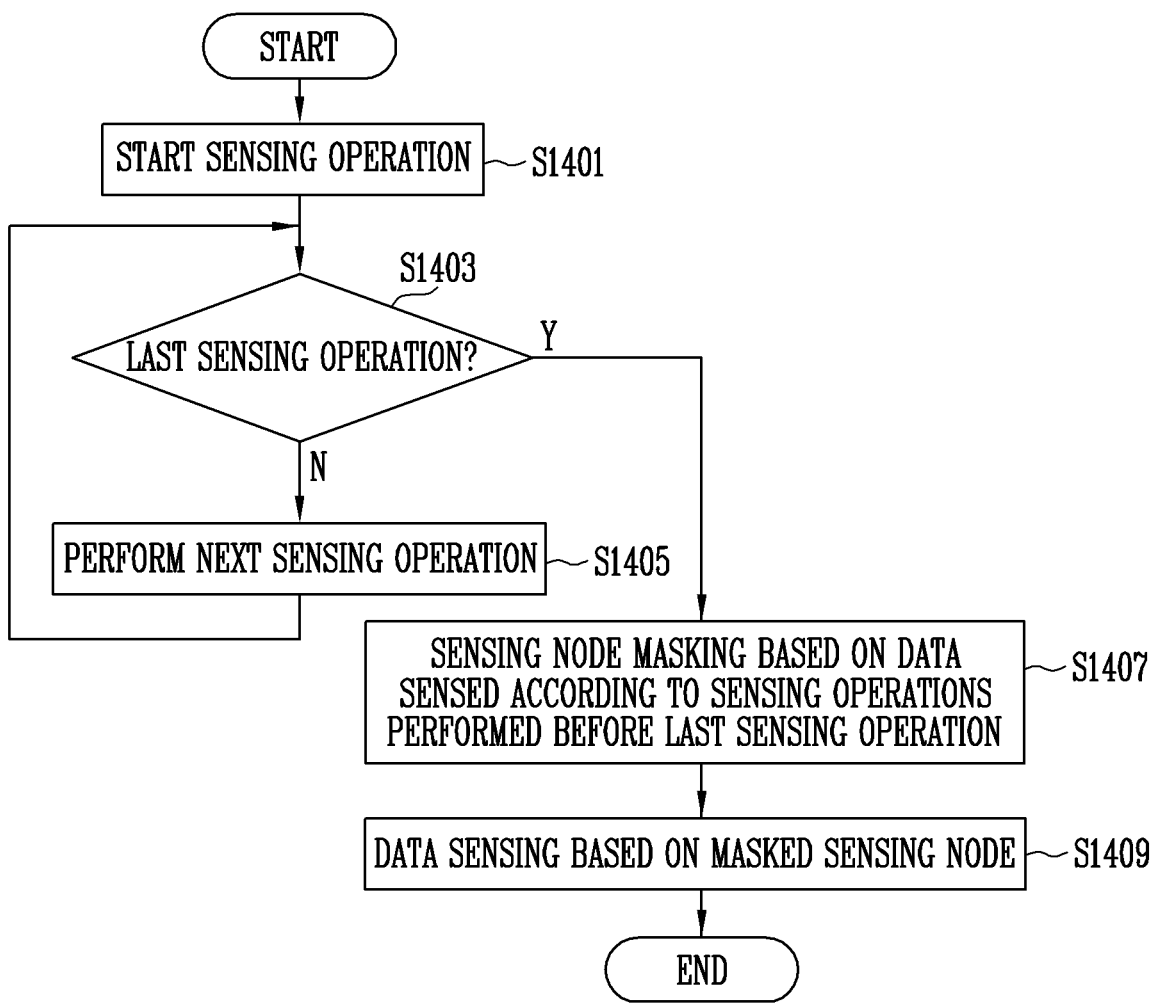
FIG. 14 illustrates an embodiment of operating a memory device.

FIG. 14 is a diagram illustrating an operation of a memory device according to an embodiment. Referring to FIG. 14, in operation S1401, the memory device may start the sensing operation. The sensing operation may be an operation of sensing any one of the plurality of logical pages in the selected page. The sensing operation on one logical page may be performed through a plurality of sensing operations.

In addition, the sensing operation may be, for example, the program verify operation included in the program loop or a read operation.

In an embodiment, when the sensing operation on one logical page is performed, the sensing operation may be performed with three or more sensing voltages.

In operation S1403, the memory device may determine whether the sensing operation that is being performed is the last sensing operation. For example, the memory device may determine whether the sensing operation being performed is the last sensing operation among the plurality of sensing operations on one logical page.

In an embodiment, when the sensing operation is not the last sensing operation (N), the operation may proceed to operation S1405 and a next sensing operation may be performed. Thereafter, it may be determined whether the sensing operation being performed again is the last sensing operation (S1403).

In an embodiment, when the sensing operation is the last sensing operation (Y), operation S1407 may be performed.

In operation S1407, the memory device may mask the sensing node based on the data sensed according to the sensing operations performed before the last sensing operation. For example, during the last sensing operation, the data sensed to the sensing node through the bit line may be read. Thereafter, according to the sensed data, the potential of the sensing node may be changed. This may be referred to as evaluation. According to the changed potential of the sensing node, the sensed data may be stored in the latch.

However, when the data is stored in the latch based on the data sensed to the sensing node, a plurality of latches may be flipped. Therefore, in operation S1407, the masking operation may be performed. For example, the masking operation may be performed with a value of the sensing node which corresponds to flipped latches based on the data sensed before the last sensing operation. When the masking operation is performed, the value of the sensing node may be set regardless of the data sensed by the evaluation operation.

In operation S1409, the memory device may sense the data based on the masked sensing node. For example, when the value of the sensing node is '0', the sensed data may be maintained as '1,' which is the default value. When the value of the sensing node is '1', the sensed data may be changed from '1,' which is the default value, to '0'.

Figure 15:
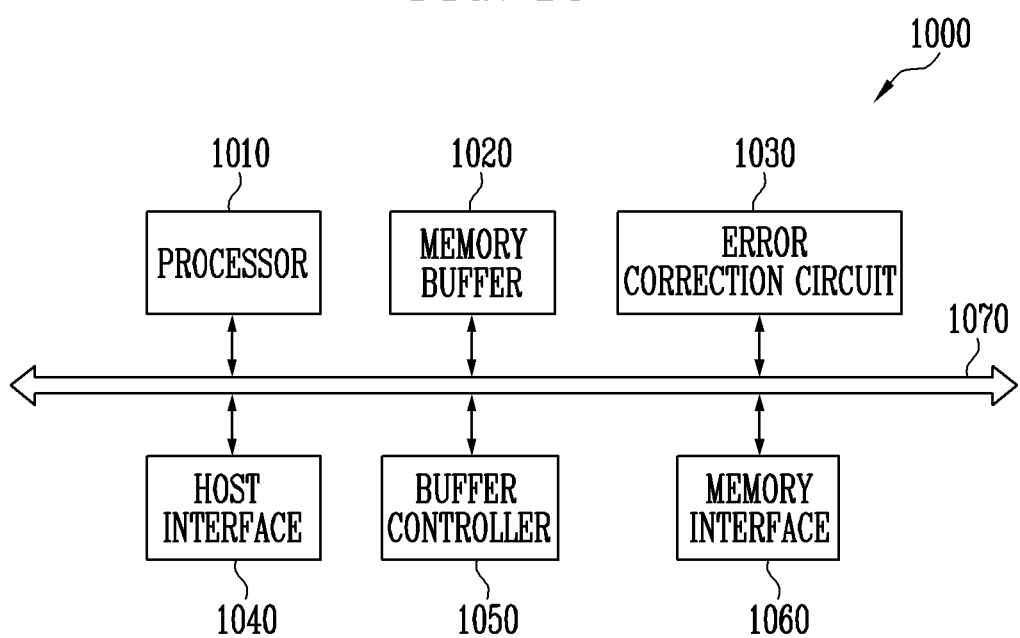
FIG. 15 illustrates an embodiment of a memory controller.

FIG. 15 is a diagram illustrating an embodiment of the memory controller 1000 of FIG. 1. The memory controller 1000 is connected to a host and the memory device, and is configured to access the memory device in response to a request from the host Host. For example, the memory controller 1000 is configured to control write, read, erase, and background operations of the memory device. The memory controller 1000 may also be configured to serve as an interface between the memory device and the host and/or to drive firmware for controlling the memory device.

Referring to FIG. 15, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide one or more channels between or among components of the memory controller 1000.

The processor 1010 may control overall operations of the memory controller 1000 and may perform logical operations. The processor 1010 may communicate with an external host through the host interface 1040 and may communicate with the memory device through the memory interface 1060. In addition, the processor 1010 may communicate with the memory buffer 1020 through the buffer controller 1050. The processor 1010 may control operation of the storage device using the memory buffer 1020 as an operation memory, a cache memory, or a buffer memory.

In one embodiment, the processor 1010 may perform the function of the FTL. For example, the processor 1010 may translate an LBA provided by the host to a PBA through the FTL. The FTL may receive the LBA and may translate the LBA to the PBA using a mapping table. The flash translation layer perform one or a plurality of address mapping methods according to a mapping unit. Examples of address mapping methods include a page mapping method, a block mapping method, and a hybrid mapping method.

In one embodiment, the processor 1010 may be configured to randomize data received from the host. For example, the processor 1010 may randomize data from the host using a randomizing seed. The randomized data may be provided to the memory device as data to be stored and may be programmed to the memory cell array. The processor 1010 may perform the randomization and the de-randomization, for example, by driving instructions, e.g., firmware or various other types of software.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. In one embodiment, the memory buffer 1020 may include a static RAM (SRAM) or a dynamic RAM (DRAM).

The error correction circuit 1030 may perform error correction (e.g., error correction encoding (ECC encoding)) on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 is configured to communicate with an external host under control of the processor 1010. The host interface 1040 may be configured to perform communications using one or more methods, standards, or protocols. Examples include a universal serial bus (USB), a serial AT attachment (SATA), a serial attached SCSI (SAS), a high speed interchip (HSIC), a small computer system interface (SCSI), a peripheral component interconnection express (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate commands, addresses, and data with the memory device through one or more corresponding channels.

In one embodiment, the memory controller 1000 may not include the memory buffer 1020 and the buffer controller 1050.

In one embodiment, the processor 1010 may control operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

In one embodiment, the bus 1070 of the memory controller 1000 may be divided into a control bus and a data bus. The data bus may be configured to transmit data within the memory controller 1000, and the control bus may be configured to transmit control information (e.g., commands, addresses, and/or other information) within the memory controller 1000. In one embodiment, the data bus and the control bus may be separated from each other and may not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1020, and the memory interface 1060.

Figure 16:
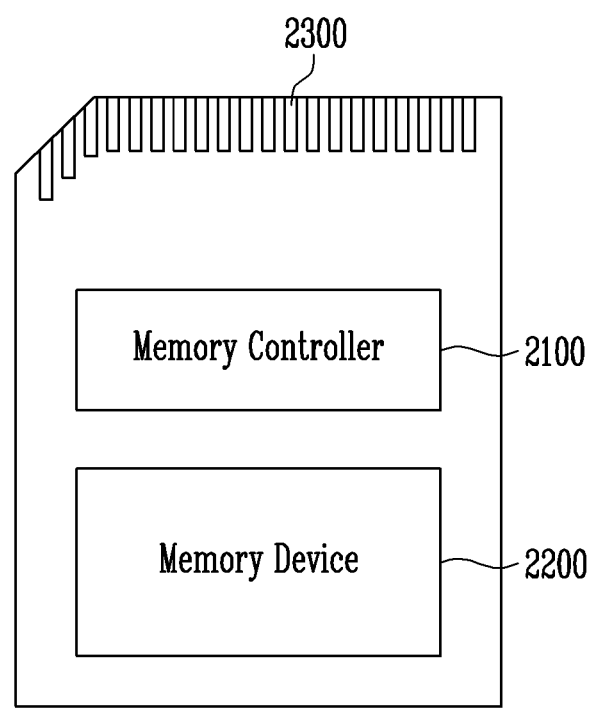
FIG. 16 illustrates an embodiment of a memory card.

FIG. 16 is a block diagram illustrating an embodiment of a memory card system to which a storage device as described herein may be applied.

Referring to FIG. 16, the memory card system 2000 includes a memory controller 2100, a memory device 2200, and a connector 2300. The memory controller 2100 is connected to the memory device 2200 and is configured to access the memory device 2200. For example, the memory controller 2100 may be configured to control read, write, erase, background, and/or other operations of the memory device 2200. The memory controller 2100 may serve as an interface between the memory device 2200 and the host. The memory controller 2100 may be configured to drive instructions (e.g., firmware or other types of software) for controlling the memory device 2200. The memory device 2200 may be implemented equally to the memory device 100 of FIG. 1 described with reference to FIG. 2.

The memory controller 2100 may include, for example, a random access memory (RAM), a processor, a host interface, a memory interface, and/or an error correction circuit.

The memory controller 2100 may communicate with an external device through the connector 2300. The memory controller 2100 may communicate with an external device (for example, the host) according to a specific communication standard, protocol or method. Examples include a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the communication standards described above.

As an example, the memory device 2200 may be implemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. Examples include a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, the memory device 2200 may perform a sensing operation on a selected page. In one embodiment, the memory device 2200 may perform a sensing operation on a plurality of logical pages in the selected page. At this time, the sensing operation may be the verify operation, among the program operation and the verify operation included in the program loop or a read operation.

In an embodiment, the memory device 2200 may perform a sensing operation on one of the plurality of logical pages. The sensing operation on one logical page may be performed with a plurality of sensing voltages, which, for example, may be sequentially used for the sensing operation from a sensing voltage of a high level to a sensing voltage of a low level.

However, when the sensing operation is performed with the sensing voltage of the low level after performing the sensing operation with the sensing voltage of the high level, a plurality of latches may be flipped. In this case, the value of the sensing node may be masked to reduce the number of latches that are flipped.

For example, the masking operation indicating the flipped latches when sensing with the sensing voltage of the high level, may be performed. In one embodiment, when the memory device 2200 senses with the sensing voltage of the low level, the memory device 2200 may mask the value sensed to the sensing node as the value indicating the flipped latches. When the masking operation is performed, the value of the sensing node may be set regardless of the value sensed to the sensing node.

When the value of the sensing node is set, data may be stored in the latch according to the value of the sensing node. At this time, the number of flipped latches may be decreased in a process in which the data is stored in the latch. Therefore, noise generated during the sensing operation may be reduced.

Figure 17:
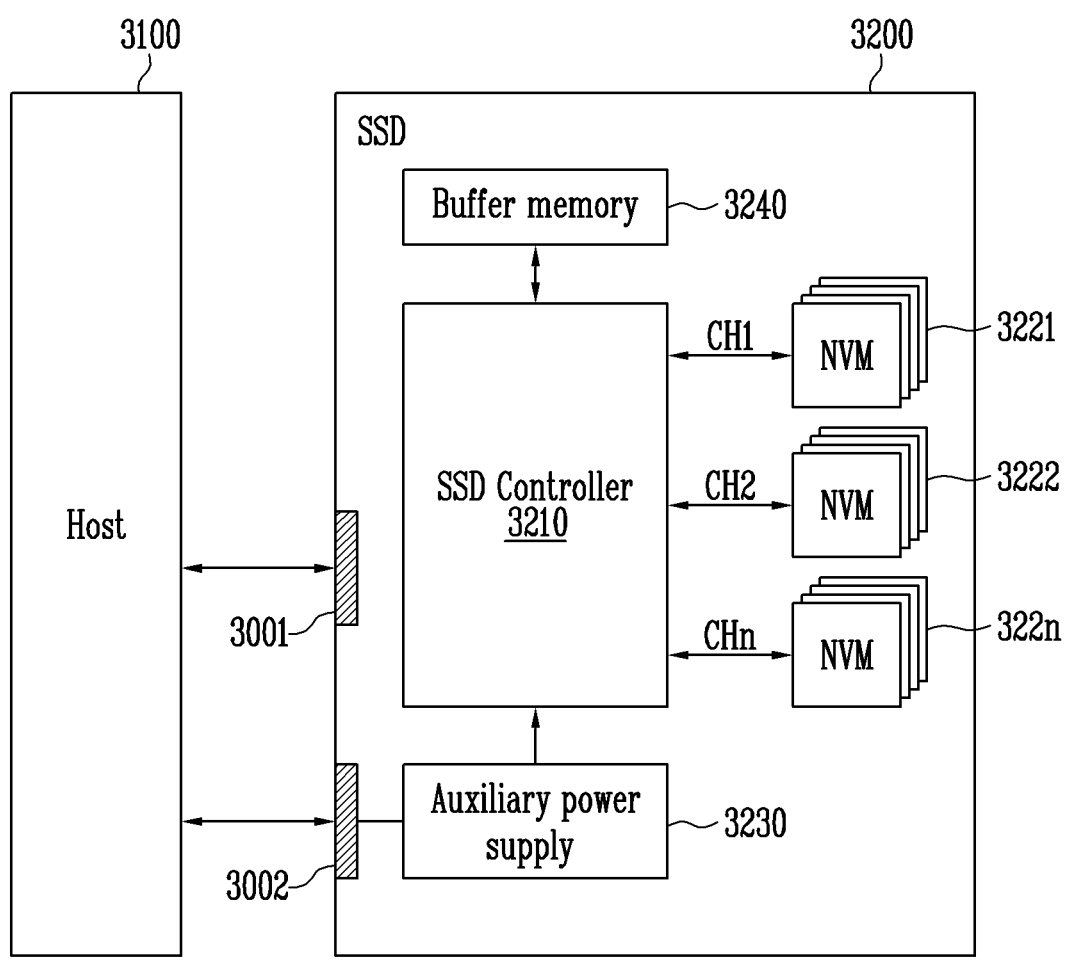
FIG. 17 illustrates an embodiment of a solid state drive (SSD) system.

FIG. 17 is a block diagram illustrating an embodiment of a solid state drive (SSD) system, to which a storage device as described herein may be applied.

Referring to FIG. 17, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 described with reference to FIG. 1. The SSD controller 3210 may control the plurality of flash memories 3221 to 322n in response to the signal SIG received from the host 3100. As an example, the signal SIG may be signals based on one or more interfaces between the host 3100 and the SSD 3200. Examples include at least one of a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322*n*, or may temporarily store metadata (for example, a mapping table) of the flash memories 3221 to 322*n*. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

In an embodiment, each of the plurality of flash memories 3221 to 322*n* may perform a sensing operation on a selected page. For example, the plurality of flash memories 3221 to 322*n* may perform a sensing operation on a plurality of logical pages in the selected page. At this time, the sensing operation may be the verify operation, among the program operation and the verify operation in the program loop or a read operation.

In an embodiment, each of the plurality of flash memories 3221 to 322*n* may perform a sensing operation on any one of the plurality of logical pages. The sensing operation on one logical page may be performed with a plurality of sensing voltages. The plurality of sensing voltages may be sequentially used for the sensing operation from a sensing voltage of a high level to a sensing voltage of a low level.

However, when the sensing operation is performed with the sensing voltage of the low level after performing the sensing operation with the sensing voltage of the high level, a plurality of latches may be flipped. In this case, the value of the sensing node may be masked to reduce the number of flipped latches.

For example, the masking operation indicating the flipped latches when sensing with the sensing voltage of the high level, may be performed. For example, when the plurality of flash memories 3221 to 322*n* sense with the sensing voltage of the low level, the plurality of flash memories 3221 to 322*n* may mask the value sensed to the sensing node as the value indicating the flipped latches. When the masking operation is performed, the value of the sensing node may be set regardless of the value sensed to the sensing node.

When the value of the sensing node is set, data may be stored in the latch according to the value of the sensing node. At this time, the number of flipped latches may be decreased in a process in which the data is stored in the latch. Therefore, noise generated during the sensing operation may be reduced.

Figure 18:
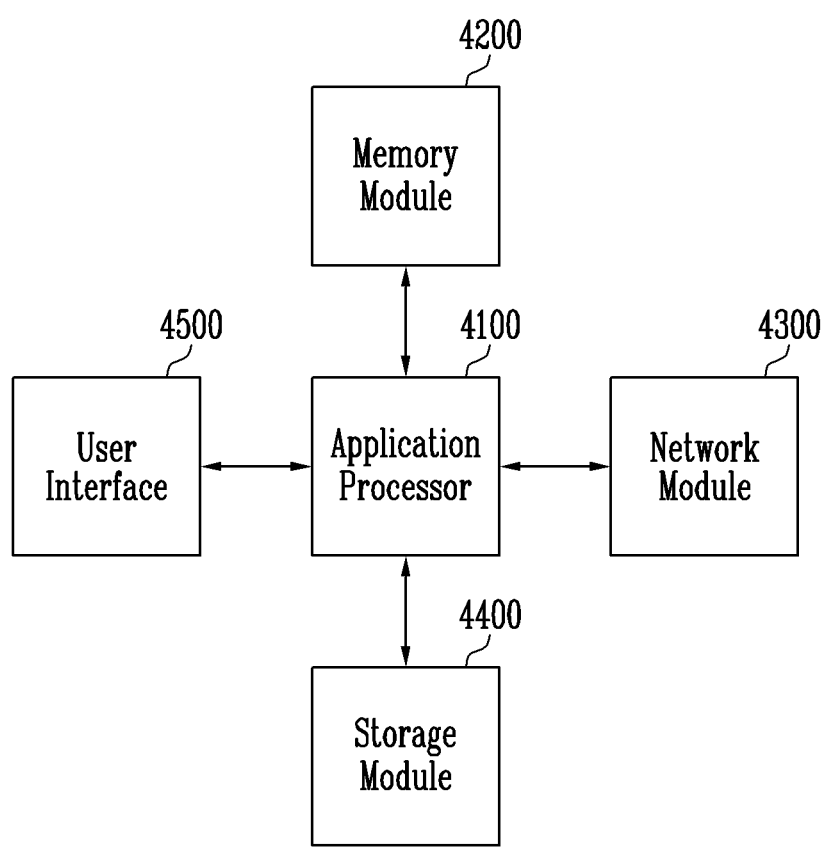
FIG. 18 illustrates an embodiment of a user system.

FIG. 18 is a block diagram illustrating an embodiment of a user system, to which a storage device as described herein may be applied.

Referring to FIG. 18, the user system 4000 includes an application processor 4100, a memory module 4200, a network module 4300, a storage module 4400, and a user interface 4500. The application processor 4100 may drive components, an operating system (OS), a user program, and/or other features of the user system 4000. The application processor 4100 may include controllers, interfaces, graphics engines, and/or other features that control components in the user system 4000. In one implementation, the application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data, for example, received from the application processor 4100. In one embodiment, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

In one embodiment, the storage module 4400 may include a plurality of nonvolatile memory devices, which may operate similarly or identically to the memory device described with reference to FIGS. 2 and 3. The storage module 4400 may operate similarly or identically to the storage device 50 described with reference to FIG. 1.

The user interface 4500 may include one or more interfaces for inputting data or instructions to the application processor 4100 or for outputting data and/or instructions to an external device. Examples of the user interface 4500 include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include one or more user output interfaces, such as a liquid crystal display (LCD), an organic light emitting diode (OLED) display device, an active matrix OLED (AMO-LED) display device, an LED, a speaker, and a monitor.

In an embodiment, the storage module 4400 may perform a sensing operation on a selected page. In one embodiment, the storage module 4400 may perform a sensing operation on a plurality of logical pages in the selected page. At this time, the sensing operation may be the verify operation, among the program operation and the verify operation in the program loop or a read operation.

In an embodiment, the storage module 4400 may perform a sensing operation on any one of the plurality of logical pages. The sensing operation on one logical page may be performed with a plurality of sensing voltages. In one embodiment, the plurality of sensing voltages may be sequentially used for the sensing operation from a sensing voltage of a high level to a sensing voltage of a low level.

However, when the sensing operation is performed with the sensing voltage of the low level after performing the sensing operation with the sensing voltage of the high level, a plurality of latches may be flipped. In this case, the value of the sensing node may be masked to reduce the number of flipped latches.

For example, the masking operation indicating the flipped latches when sensing with the sensing voltage of the high level, may be performed. For example, when the storage module 4400 senses with the sensing voltage of the low level, the storage module 4400 may mask the value sensed to the sensing node as the value indicating the flipped latches. When the masking operation is performed, the value of the sensing node may be set regardless of the value sensed to the sensing node.

In accordance with one or more of the aforementioned embodiments, when the value of the sensing node is set, data may be stored in a latch according to the value of a sensing node. At this time, the number of flipped latches may be decreased in a process in which the data is stored in the latch. Therefore, noise generated during the sensing operation may be reduced.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps may be omitted. In each embodiment, the operations are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure. One or more embodiments may be combined to form additional embodiments.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
    a plurality of pages, each including a plurality of memory cells;
    a peripheral circuit configured to sense a selected page among the plurality of pages, the selected page including a selected memory cell; and
    a sensing node controller configured to control, based on a result of a first sensing operation among a plurality of sensing operations that are performed to sense a logical page among a plurality of logical pages in the selected page, a sensing node in a page buffer coupled to the selected memory cell through a bit line during a second sensing operation.

2. The memory device of claim 1, wherein the sensing operation includes a program verify operation or a read operation.

3. The memory device of claim 1, wherein a level of a first sensing voltage used during the first sensing operation is higher than a level of a second sensing voltage used during the second sensing operation.

4. The memory device of claim 1, further comprising:
    a first sensing data storage configured to store first sensing data sensed through the sensing node during the first sensing operation; and
    a second sensing data storage configured to store second sensing data sensed through the sensing node during the second sensing operation.

5. The memory device of claim 4, wherein:
    the first sensing data storage outputs the first sensing data to the sensing node controller during the second sensing operation; and
    the sensing node controller determines whether a latch in the page buffer is flipped based on the first sensing data.

6. The memory device of claim 4, wherein the sensing node controller determines that latches in the page buffer are flipped when the first sensing data has a value different from a default value.

7. The memory device of claim 4, wherein the sensing node controller outputs a masking value that corresponds to the latch flipped based on the first sensing data, when the second sensing data is sensed to the sensing node.

8. The memory device of claim 7, wherein a potential of the sensing node is set according to the masking value.

9. The memory device of claim 8, wherein the second sensing data storage stores the second sensing data sensed through the sensing node which is set according to the masking value.

10. The memory device of claim 1, wherein the sensing node controller controls the sensing node in the page buffer coupled to the selected memory cell through the bit line during a last sensing operation, according to sensing data obtained by one or more sensing operations performed before the last sensing operation among the plurality of sensing operations, when the plurality of sensing operations are performed to sense any one logical page among the plurality of logical pages included in the selected page.

11. The memory device of claim 10, wherein the sensing node controller determines whether a latch in the page buffer is flipped based on the sensing data.

12. The memory device of claim 10, wherein the sensing node controller outputs, based on the sensing data, a masking value that corresponds to a latch flipped according to a sensing operation before the last sensing operation.

13. The memory device of claim 12, wherein:
    the sensing node is set according to the masking value; and
    data sensed through the sensing node which is set according to the masking value, is stored during the last sensing operation.

14. A method of operating a memory device configured to sense a selected page including a selected memory cell, among a plurality of pages each including a plurality of memory cells, the method comprising:
    performing a first sensing operation to sense a logical page among a plurality of logical pages in the selected page; and controlling, during a second sensing operation for sensing the logical page, a sensing node in a page buffer coupled to the selected memory cell through a bit line, based on a result of the first sensing operation.

15. The method of claim 14, wherein a level of a first sensing voltage used during the first sensing operation is higher than a level of a second sensing voltage used during the second sensing operation.

16. The method of claim 14,
wherein the memory device further comprises:
  a first sensing data storage configured to store first sensing data sensed through the sensing node during the first sensing operation; and
  a second sensing data storage configured to store second sensing data sensed through the sensing node during the second sensing operation, and
wherein the controlling of the sensing node includes determining that one or more latches in the page buffer are flipped when the first sensing data has a value different from the default value.

17. The method of claim 16, wherein the controlling of the sensing node includes setting, when the second sensing data is sensed to the sensing node, a potential of the sensing node as a masking value corresponding to a latch in the page buffer, flipped according to the first sensing data.

18. The method of claim 17, further comprising storing the second sensing data sensed through the sensing node.

19. An apparatus comprising:
  an output coupled to a sensing node of a page buffer; and
  a controller configured to generate a masking value for transfer to the sensing node through the output based on a result of a first sensing operation different from a second sensing operation,
wherein the second sensing operation is performed after the first sensing operation and during a time when the sensing node is coupled to a selected memory cell.

* * * * *